(12) United States Patent
Watanabe et al.

(10) Patent No.: US 12,113,011 B2
(45) Date of Patent: Oct. 8, 2024

(54) SEMICONDUCTOR DEVICE AND METHOD OF MANUFACTURING THE SAME

(71) Applicant: FUJI ELECTRIC CO., LTD., Kawasaki (JP)

(72) Inventors: Hiroto Watanabe, Mitaka (JP); Sho Takano, Hino (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/955,709

(22) Filed: Sep. 29, 2022

(65) Prior Publication Data

US 2023/0121889 A1    Apr. 20, 2023

(30) Foreign Application Priority Data

Oct. 18, 2021   (JP) .................................. 2021-170383

(51) Int. Cl.
*H01L 23/50* (2006.01)
*H01L 21/48* (2006.01)
*H01L 23/13* (2006.01)

(52) U.S. Cl.
CPC .......... *H01L 23/50* (2013.01); *H01L 21/4814* (2013.01); *H01L 23/13* (2013.01)

(58) Field of Classification Search
CPC . H01L 23/3735; H01L 23/50; H01L 21/4814; H01L 23/13
See application file for complete search history.

(56) References Cited

U.S. PATENT DOCUMENTS

| | | | |
|---|---|---|---|
| 8,466,541 B2 | 6/2013 | Jones et al. | |
| 10,405,450 B2 | 9/2019 | Mcpherson et al. | |
| 2013/0279230 A1 | 10/2013 | Suwa et al. | |
| 2015/0145123 A1* | 5/2015 | Ha | H01L 23/3121 257/737 |
| 2018/0211938 A1 | 7/2018 | Tsuyuno et al. | |
| 2018/0218963 A1 | 8/2018 | Hojo et al. | |
| 2020/0118986 A1* | 4/2020 | Hori | H01L 23/427 |

FOREIGN PATENT DOCUMENTS

| | | |
|---|---|---|
| EP | 2657966 A1 | 10/2013 |
| EP | 3331009 A1 | 6/2018 |
| JP | H10-107174 A | 4/1998 |
| JP | 2005-093513 A | 4/2005 |
| JP | 2006013076 A * | 1/2006 |

(Continued)

*Primary Examiner* — Yara B Green
*Assistant Examiner* — Fakeha Sehar
(74) *Attorney, Agent, or Firm* — Rabin & Berdo, P.C.

(57) ABSTRACT

A bus bar includes a laminated body formed by directly laminating a flat plate-shaped first conductive plate, flat plate-shaped insulating sheet, and flat plate-shaped second conductive plate. The laminated body has main terminal connection parts into which end portions of external connection terminals are inserted, and is sealed in a sealing body, except the main terminal connection parts. The first conductive plate, insulating sheet, and second conductive plate are pressurized toward the insulating sheet in the lamination direction of the laminated body so that volumes of air spaces inside the insulating sheet (and air spaces between the first conductive plate and the insulating sheet and between the second conductive plate and the insulating sheet) are compressed.

13 Claims, 18 Drawing Sheets

(56) References Cited

FOREIGN PATENT DOCUMENTS

| | | |
|---|---|---|
| JP | 3127850 U | 12/2006 |
| JP | 2007-042569 A | 2/2007 |
| JP | 2012-119618 A | 6/2012 |
| JP | 2012-138409 A | 7/2012 |
| JP | 2016-059147 A | 4/2016 |
| JP | 2017-034050 A | 2/2017 |
| JP | 2020-064913 A | 4/2020 |
| JP | 2020-194765 A | 12/2020 |

* cited by examiner

SEMICONDUCTOR DEVICE AND METHOD OF MANUFACTURING THE SAME

CROSS-REFERENCE TO RELATED APPLICATION

This application is based upon and claims the benefit of priority of the prior Japanese Patent Application No. 2021-170383, filed on Oct. 18, 2021, the entire contents of which are incorporated herein by reference.

BACKGROUND OF THE INVENTION

1. Field of the Invention

The embodiments discussed herein relate to a semiconductor device and a method of manufacturing the same.

2. Background of the Related Art

Semiconductor modules include semiconductor chips including power devices and are used as power conversion devices. The power devices are switching elements. For example, the switching elements are insulated gate bipolar transistors (IGBTs) and power metal oxide semiconductor field effect transistors (MOSFETs). A semiconductor device has semiconductor modules electrically connected as appropriate to implement desired functions. To connect the plurality of semiconductor modules, a connection member is used. Examples of the connection member include a bus bar (for example, see Japanese Laid-open Patent Publication No. 2020-064913) and a connector (for example, see U.S. Pat. No. 8,466,541). Such a connection member is formed by laminating an insulating member and conductive members respectively provided on the front and rear surfaces of the insulating member. Such a structure may be used for a pair of conductive plates and an insulating sheet that are accommodated in a module case (see, for example, Japanese Laid-open Patent Publication No. 2012-138409), and a ceramic substrate having copper plates respectively formed on the front and rear surfaces thereof (see, for example, Japanese Laid-open Patent Publication No. 10-107174).

Further, conductive members are pressed and attached to the front and rear surfaces of an insulating member in a layered structure (for example, Japanese Laid-open Patent Publication No. 10-107174 and Utility Model Registration No. 3127850). By doing so, it is possible to attach the conductive members to the insulating member without generating voids between the insulating member and each conductive member. It is known that, if voids (air spaces) are generated between the insulating member and each conductive member, partial discharge occurs when a high voltage is applied to the electrode (see, for example, Japanese Laid-open Patent Publications Nos. 2017-034050 and 2016-059147).

By the way, a bus bar that connects a plurality of semiconductor modules is formed by laminating a p-type conductive layer, an insulating layer, and an n-type conductive layer. Air spaces may exist in the insulating layer between the p-type and n-type conductive layers. If a voltage is applied to such a bus bar, partial discharge may occur in the air spaces, which may cause electrical breakdown. A semiconductor device with such a bus bar reduces its reliability.

SUMMARY OF THE INVENTION

According to one aspect, there is provided a semiconductor device, including a semiconductor module including a plurality of semiconductor chips and a plurality of external connection terminals, the plurality of external connection terminals being electrically connected to respective ones of the plurality of semiconductor chips and each extending outside the semiconductor module; and a bus bar including a laminated body that includes a flat plate-shaped first conductive member, a flat plate-shaped organic insulating member and a flat plate-shaped second conductive member that are directly and sequentially laminated in this order in a lamination direction, the organic insulating member having a void or a surface with roughness, the laminated body having a plurality of insertion holes into which the plurality of external connection terminals are respectively inserted, the bus bar, except the plurality of insertion holes thereof, being sealed with a sealing material, the first and second conductive members having end portions that respectively form a first external connection portion and a second external connection portion that are exposed outside of the sealing material.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Figure 1:
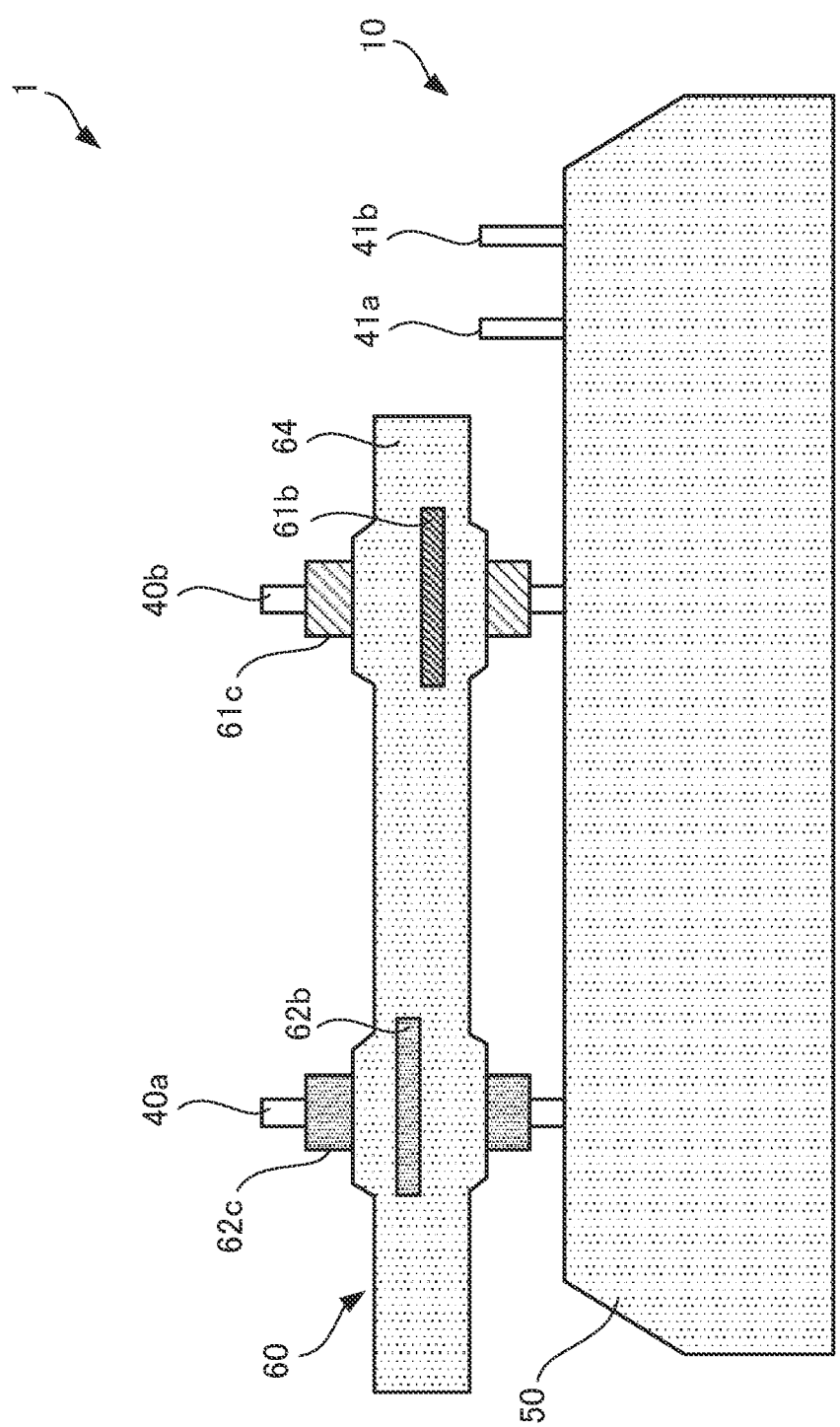
FIG. 1 is a side view of a semiconductor device according to a first embodiment.

Hereinafter, some embodiments will be described with reference to the accompanying drawings. In the following description, the terms "front surface" and "top surface" refer to surfaces facing up in a semiconductor device, semiconductor module, and bus bar illustrated in the drawings. Similarly, the term "up" refers to an upward direction in the semiconductor device, semiconductor module, and bus bar illustrated in the drawings. The terms "rear surface" and "bottom surface" refer to surfaces facing down in the semiconductor device, semiconductor module, and bus bar illustrated in the drawings. Similarly, the term "down" refers to a downward direction in the semiconductor device, semiconductor module, and bus bar illustrated in the drawings. The same directionality applies to drawings other than other drawings, as appropriate. The terms "front surface," "top surface," "up," "rear surface," "bottom surface," "down," and "side surface" are used for convenience to describe relative positional relationships, and do not limit the technical ideas of the embodiments. For example, the terms "up" and "down" are not always related to the vertical direction to the ground. That is, the "up" and "down" directions are not limited to the gravity direction. In addition, in the following description, the term "principal component" refers to a component contained at a volume ratio of 80 vol % or more.

First Embodiment

Figure 2:
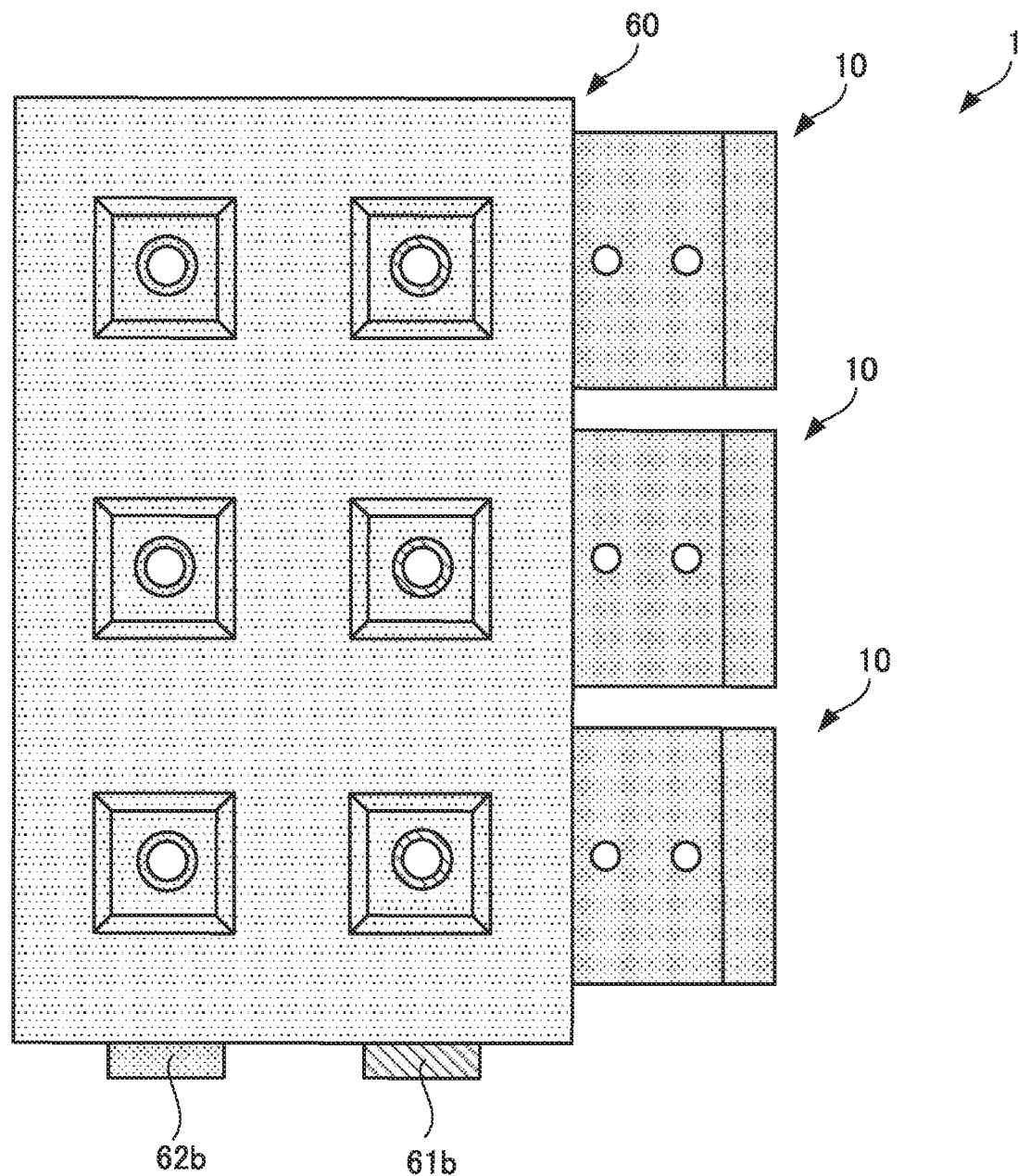
FIG. 2 is a plan view of the semiconductor device according to the first embodiment.

A semiconductor device according to a first embodiment will be described with reference to FIGS. 1 and 2. FIG. 1 is a side view of the semiconductor device according to the first embodiment, and FIG. 2 is a plan view of the semiconductor device according to the first embodiment. In this connection, FIG. 1 is a side view of the semiconductor device 1 of FIG. 2 seen in the positive Y direction.

The semiconductor device 1 includes semiconductor modules 10 and a bus bar 60. Each semiconductor module 10 includes external connection terminals 40a and 40b, a control terminal 41a, and a sense terminal 41b. The external connection terminals 40a and 40b, control terminal 41a, and sense terminal 41b are arranged in a line on the front surface of the semiconductor module 10. In addition, the external connection terminals 40a and 40b, control terminal 41a, and sense terminal 41b are each conductively connected to semiconductor chips, which will be described later, inside the semiconductor module 10. The semiconductor module 10 will be described in detail later. Three semiconductor modules 10 with the above structure are aligned with their long sides being parallel to each other.

In the bus bar 60, a p-type conductive plate and an n-type conducive plate are sealed in a sealing body 64. The p-type and n-type conductive plates have main terminal connection parts 61c and 62c, respectively. The external connection portions 61b and 62b extend from a side of the sealing body 64 to the outside of the sealing body 64. In addition, the bus bar 60 is disposed over the three aligned semiconductor modules 10. The external connection terminals 40a and 40b of the semiconductor modules 10 are inserted in the bus bar 60. The external connection terminals 40a and 40b are directly connected to the n-type and p-type conductive plates, respectively, inside the bus bar 60. The bus bar 60 will be described in detail later.

Figure 3:
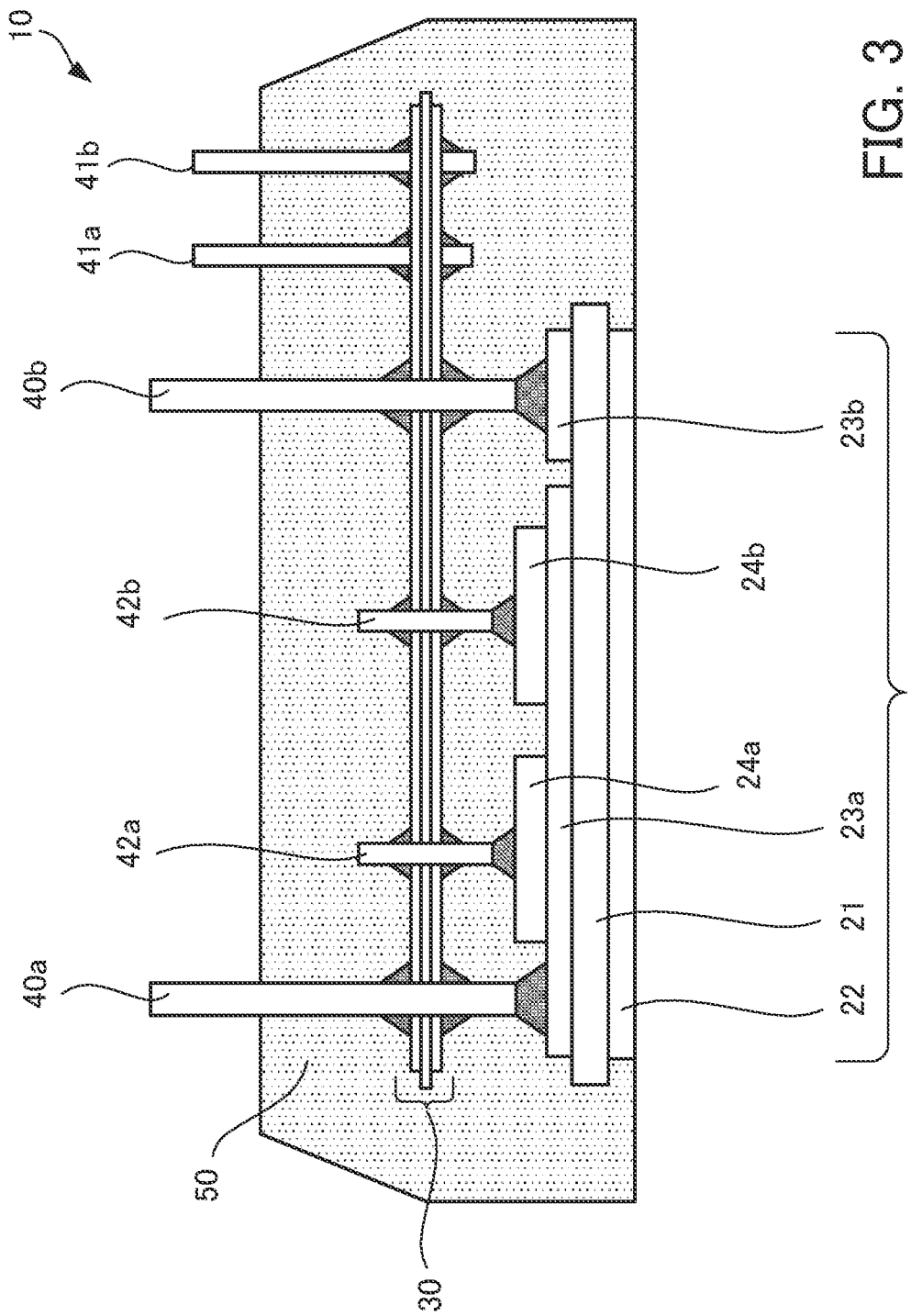
FIG. 3 is a side sectional view of a semiconductor module.
Figure 4:
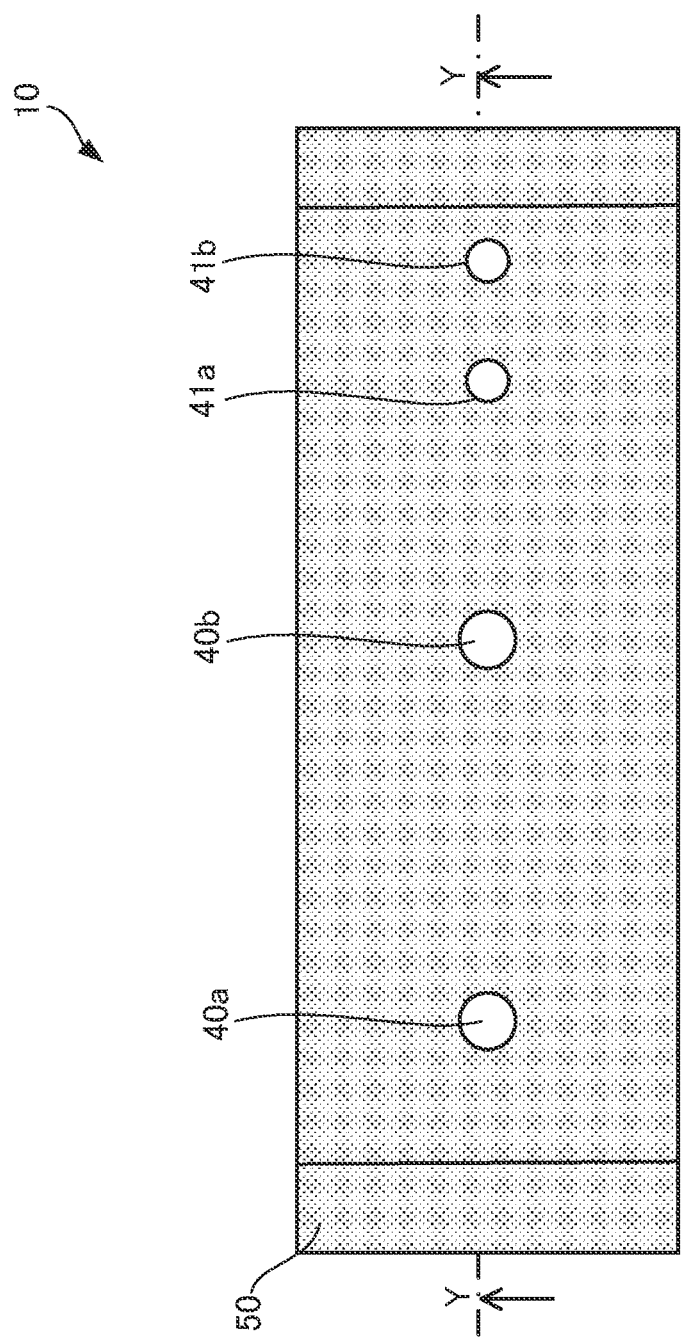
FIG. 4 is a plan view of the semiconductor module.
Figure 4:
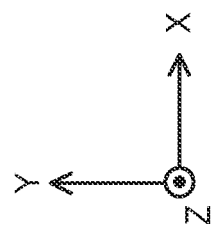

A semiconductor module 10 will now be described with reference to FIGS. 3 and 4. FIG. 3 is a side sectional view of the semiconductor module, and FIG. 4 is a plan view of the semiconductor module. In this connection, FIG. 3 is a sectional view taken along the dash-dotted line Y-Y of FIG. 4.

As illustrated in FIG. 3, the semiconductor module 10 includes an insulated circuit substrate 20, semiconductor chips 24a and 24b, a printed circuit substrate 30, the external connection terminals 40a and 40b, the control terminal 41a, the sense terminal 41b, and conductive posts 42a and 42b. These components of the semiconductor module 10 are sealed in a main body 50 such that the rear surface of the insulated circuit substrate 20 is exposed. The semiconductor module 10 has a substantially cubic shape (a rectangular shape in plan view) because of the main body 50. In this connection, the upper edges of the short sides of the main body 50 are tapered.

The insulated circuit substrate 20 includes an insulating plate 21, a metal plate 22 disposed on the rear surface of the insulating plate 21, and circuit patterns 23a and 23b disposed on the front surface of the insulating plate 21. The insulating plate 21 and metal plate 22 are rectangular in plan view. In addition, the corners of the insulating plate 21 and metal plate 22 may be rounded or chamfered. The area of the metal plate 22 is smaller than that of the insulating plate 21 and is formed inside the insulating plate 21 in plan view. The insulating plate 21 is made of ceramics or insulating resin with high thermal conductivity. Examples of the ceramics include aluminum oxide, aluminum nitride, and silicon nitride. Examples of the insulating resin include a paper phenolic board, a paper epoxy board, a glass composite board, and a glass epoxy board.

The metal plate 22 is made of a metal with high thermal conductivity. Examples of the metal include aluminum, iron, silver, copper, and an alloy containing at least one of these. The thickness of the metal plate 22 is in the range of 0.1 mm to 4.0 mm, inclusive. Plating may be performed on the surface of the metal plate 22 to improve its corrosion resistance. Examples of the plating material used here include nickel, a nickel-phosphorus alloy, and a nickel-boron alloy.

The circuit patterns 23a and 23b are made of a metal with high electrical conductivity. Examples of the metal include silver, copper, nickel, and an alloy containing at least one of these. The thicknesses of the circuit patterns 23a and 23b are in the range of 0.1 mm to 4.0 mm, inclusive. Plating may be performed on the surfaces of the circuit patterns 23a and 23b to improve their corrosion resistance. Examples of the plating material used here include nickel, a nickel-phosphorus alloy, and a nickel-boron alloy. The circuit patterns 23a and 23b are formed by forming a metal layer on the front surface of the insulating plate 21 and etching the metal layer. Alternatively, the circuit patterns 23a and 23b may be cut out from a metal layer in advance and press-bonded to the front surface of the insulating plate 21. In this connection, the circuit patterns 23a and 23b illustrated in FIG. 3 are just an example. The number of circuit patterns and the shapes, sizes, and others thereof may be determined as appropriate. As the insulated circuit substrate 20 formed of the above-described components, a direct copper bonding (DCB) substrate, an active metal brazed (AMB) substrate, or a resin insulated substrate may be used, for example.

The semiconductor chip 24a includes a switching element. The switching element is an IGBT or a power MOS- FET, for example. In the case where the semiconductor chip 24a is an IGBT, the semiconductor chip 24a has a collector electrode serving as a main electrode on the rear surface thereof and has a gate electrode serving as a control electrode and an emitter electrode serving as a main electrode on the front surface thereof. In the case where the semiconductor chip 24a is a power MOSFET, the semiconductor chip 24a has a drain electrode serving as a main electrode on the rear surface thereof and has a gate electrode serving as a control electrode and a source electrode serving as a main electrode on the front surface thereof. The rear surface of the semiconductor chip 24a is bonded to the circuit pattern 23a via a bonding member (not illustrated). The conductive post 42a is electrically and mechanically connected to the main electrode or gate electrode, where appropriate, on the front surface of the semiconductor chip 24a using a bonding member.

In addition, the semiconductor chip 24b includes a diode. The diode is a free wheeling diode (FWD) such as a Schottky barrier diode (SBD) or a P-intrinsic-N (PiN) diode, for example. The semiconductor chip 24b of this type has an output electrode (a cathode electrode) serving as a main electrode on the rear surface thereof and has an input electrode (an anode electrode) serving as a main electrode on the front surface thereof. The rear surface of the semiconductor chip 24b is bonded to the circuit pattern 23a using a bonding member (not illustrated). The conductive post 42b is electrically and mechanically connected to the main electrode on the front surface of the semiconductor chip 24b using a bonding member.

In this connection, in place of the semiconductor chips 24a and 24b, reverse-conducting (RC)-IGBT chips that have the functions of both IGBT and FWD may be used. FIG. 3 merely illustrates the case where a set of semiconductor chips 24a and 24b is provided. The structure is not limited thereto, and a desired number of sets may be provided according to the specifications and others of the semiconductor module 10.

The bonding members of bonding the semiconductor chips 24a and 24b to the circuit pattern 23a are a solder or a sintered metal. A lead-free solder is used as the solder. For example, the lead-free solder contains, as a principal component, an alloy containing at least two of tin, silver, copper, zinc, antimony, indium, and bismuth. In addition, the solder may contain an additive. Examples of the additive include nickel, germanium, cobalt, and silicon. The solder containing the additive exhibits improved wettability, gloss, and bond strength, which results in an improvement in the reliability. Examples of the metal used for the sintered metal include silver and a silver alloy. The same applies to the bonding members used for bonding the conductive posts 42a and 42b.

The printed circuit substrate 30 is provided to face the insulated circuit substrate 20. This printed circuit substrate 30 includes an insulating plate and a plurality of upper circuit patterns formed on the front surface of the insulating plate. In addition, the printed circuit substrate 30 includes a plurality of lower circuit patterns formed on the rear surface of the insulating plate. Further, the printed circuit substrate 30 has a plurality of through holes extending from the front surface to the rear surface thereof at predetermined positions. In this printed circuit substrate 30, the external connection terminals 40a and 40b and conductive posts 42a and 42b are electrically connected to the upper circuit patterns and lower circuit patterns where appropriate. In addition, the control terminal 41a and sense terminal 41b are electrically connected to the printed circuit substrate 30. The control terminal 41a is electrically connected to the conductive posts 42a and 42b via the upper circuit patterns and lower circuit patterns. The sense terminal 41b is electrically connected to the emitter electrode of the semiconductor chip 24a and the anode electrode of the semiconductor chip 24b via the upper circuit patterns and lower circuit patterns.

The insulating plate is formed in a flat plate shape and is made using an insulating material as a principal component. As such a material, a material obtained by immersing a base in a resin is used. Examples of the base includes a paper, glass cloth, and glass unwoven fabric. Examples of the resin include a phenolic resin, an epoxy resin, and a polyimide resin. Specific examples of the insulating plate include a paper phenolic board, a paper epoxy board, a glass epoxy board, a glass polyimide board, and a glass composite board. The insulating plate is rectangular in plan view. The corners of the insulating plate may be rounded or chamfered.

The upper circuit patterns and lower circuit patterns have different pattern shapes so as to implement a predetermined circuit. The upper circuit patterns and lower circuit patterns are made using a material with high electrical conductivity as a principal component. Examples of this material include silver, copper, nickel, and an alloy containing at least one of these. Plating may be performed on the surfaces of the upper circuit patterns and lower circuit patterns to improve their corrosion resistance. Examples of the plating material used here include nickel, a nickel-phosphorus alloy, and a nickel-boron alloy.

The external connection terminals 40a and 40b are press-inserted in the through holes of the printed circuit substrate 30. Furthermore, the press-insertion areas are covered with a solder. The external connection terminals 40a and 40b are electrically connected to the upper circuit patterns and lower circuit patterns of the printed circuit substrate 30. One end of the external connection terminal 40a is bonded to the circuit pattern 23a of the insulated circuit substrate 20 via a solder, and one end of the external connection terminal 40b is bonded to the circuit pattern 23b of the insulated circuit substrate 20 via the solder. These external connection terminals 40a and 40b are columnar and have a circular or rectangular cross section. The external connection terminals 40a and 40b are made using a material with high electrical conductivity as a principal component. Examples of the material include silver, copper, nickel, and an alloy containing at least one of these. Plating may be performed on the surfaces of the external connection terminals 40a and 40b to improve their corrosion resistance. Examples of the plating material used here include nickel, a nickel-phosphorus alloy, and a nickel-boron alloy.

The control terminal 41a and sense terminal 41b are press-inserted in the through holes of the printed circuit substrate 30. Furthermore, the press-insertion areas are covered with the solder. The control terminal 41a and sense terminal 41b are electrically connected to the upper circuit patterns and lower circuit patterns of the printed circuit substrate 30. These control terminal 41a and sense terminal 41b have a pin shape and have a circular or rectangular cross section. In addition, the control terminal 41a and sense terminal 41b are sufficiently longer than the conductive posts 42a and 42b. The control terminal 41a and sense terminal 41b are made using a material with high electrical conductivity as a principal component. Examples of this material include silver, copper, nickel, and an alloy containing at least one of these. Plating may be performed on the surfaces of the control terminal 41a and sense terminal 41b to improve their corrosion resistance. Examples of the plating material used here include nickel, a nickel-phosphorus alloy, and a nickel-boron alloy.

The conductive posts 42a and 42b are press-inserted in the through holes of the printed circuit substrate 30. Furthermore, the press-insertion areas are covered with the solder. The conductive posts 42a and 42b are electrically connected to the upper circuit patterns and lower circuit patterns of the printed circuit substrate 30. One end of each of the conductive posts 42a and 42b is bonded to the main electrode or control electrode of one of the semiconductor chips 24a and 24b via the solder. The conductive posts 42a and 42b are columnar and have a circular or rectangular cross section. In addition, the conductive posts 42a and 42b are sufficiently shorter than the external connection terminals 40a and 40b. The conductive posts 42a and 42b are made using a material with high electrical conductivity as a principal component. Examples of this material include silver, copper, nickel, and an alloy containing at least one of these. Plating may be performed on the surfaces of the conductive posts 42a and 42b to improve their corrosion resistance. Examples of the plating material used here include nickel, a nickel-phosphorus alloy, and a nickel-boron alloy.

The lower end portions of the external connection terminals 40a and 40b, control terminal 41a, and sense terminal 41b are sealed in the main body 50. As illustrated in FIG. 4, the external connection terminals 40a and 40b, control terminal 41a, and sense terminal 41b are aligned in a line passing through the center along the long-side direction on the front surface of the semiconductor module 10 in plan view. In addition, the conductive posts 42a and 42b are sealed in the main body 50.

The main body 50 is formed of a sealing material. The sealing material contains a thermosetting resin such as an epoxy resin, phenolic resin, or maleimide resin, and a filler, which is added to the thermosetting resin. An example of the sealing material for the main body 50 is a mixture of an epoxy resin and a filler. As the filler, an inorganic filler is used. Examples of the inorganic filler include silicon oxide, aluminum oxide, boron nitride, and aluminum nitride. In addition, the sealing material contains a mold release agent by a requisite amount. Examples of the mold release agent include wax-based, silicone-based, and fluorine-based agents. In this connection, the metal plate 22 of the insulated circuit substrate 20 is exposed on the rear surface of the semiconductor module 10 sealed with the main body 50. In this case, the metal plate 22 may be flush with the rear surface of the main body 50 or may project outwardly from the rear surface thereof.

A cooling module (not illustrated) may be attached to the rear surface of the semiconductor module 10 via a solder, a silver solder, or another. In this case, the semiconductor module 10 with attachment holes (not illustrated) and the cooling module are attached to each other by screws. This improves the heat dissipation property of the semiconductor module 10. The cooling module in this case is made using a metal with high thermal conductivity, for example. Examples of the metal include aluminum, iron, silver, copper, and an alloy containing at least one of these. In addition, as the cooling module, a heat sink with a single fin or a plurality of fins, a cooling device using cooling water, or the like may be used. Plating may be performed on the surface of the cooling module to improve its corrosion resistance. Examples of the plating material used here include nickel, a nickel-phosphorus alloy, and a nickel-boron alloy.

Note that the above-described semiconductor module 10 has a structure in which the insulated circuit substrate 20, semiconductor chips 24a and 24b, printed circuit substrate 30, and others are sealed with a sealing material to form the main body 50. The semiconductor module 10 may be obtained by accommodating the insulated circuit substrate 20, semiconductor chips 24a and 24b, printed circuit substrate 30, and others in a case and sealing the inside of the case with a sealing material with the external connection terminals 40a and 40b, control terminal 41a, sense terminal 41b, and conductive posts 42a and 42b extending upward.

Figure 5:
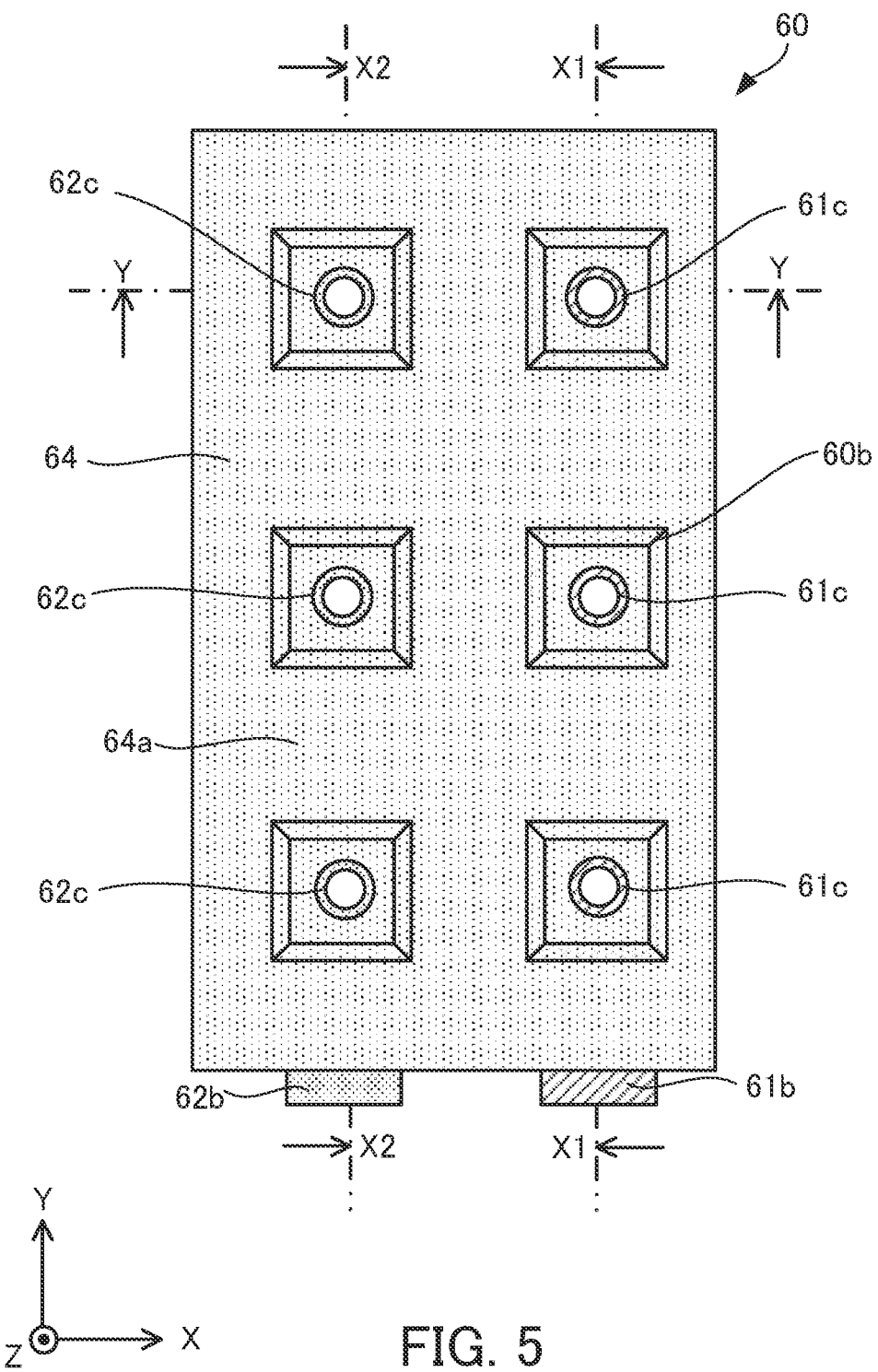
FIG. 5 is a plan view of a bus bar according to the first embodiment.
Figure 6:
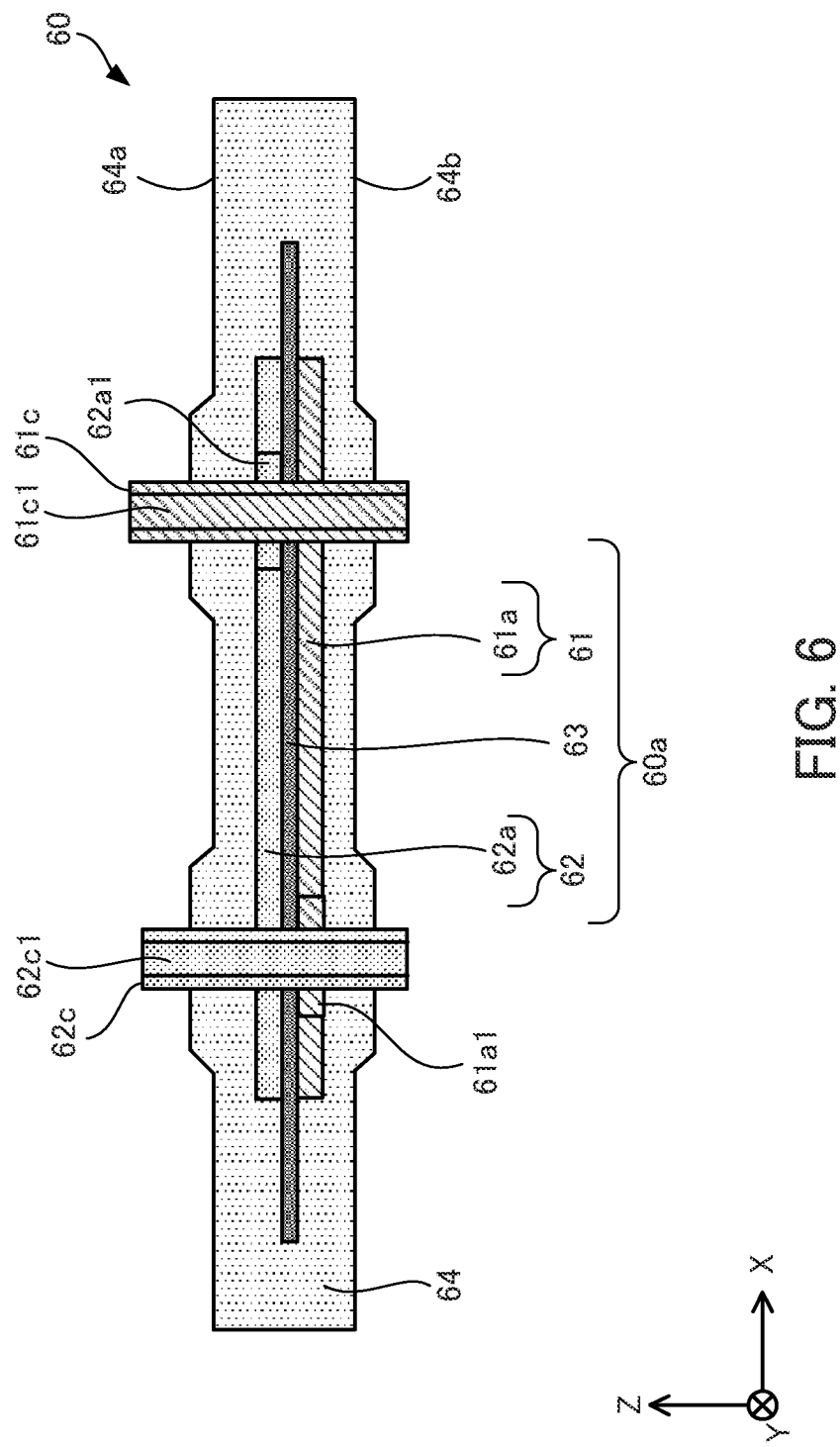
FIG. 6 is a first sectional view of the bus bar according to the first embodiment.
Figure 7A:
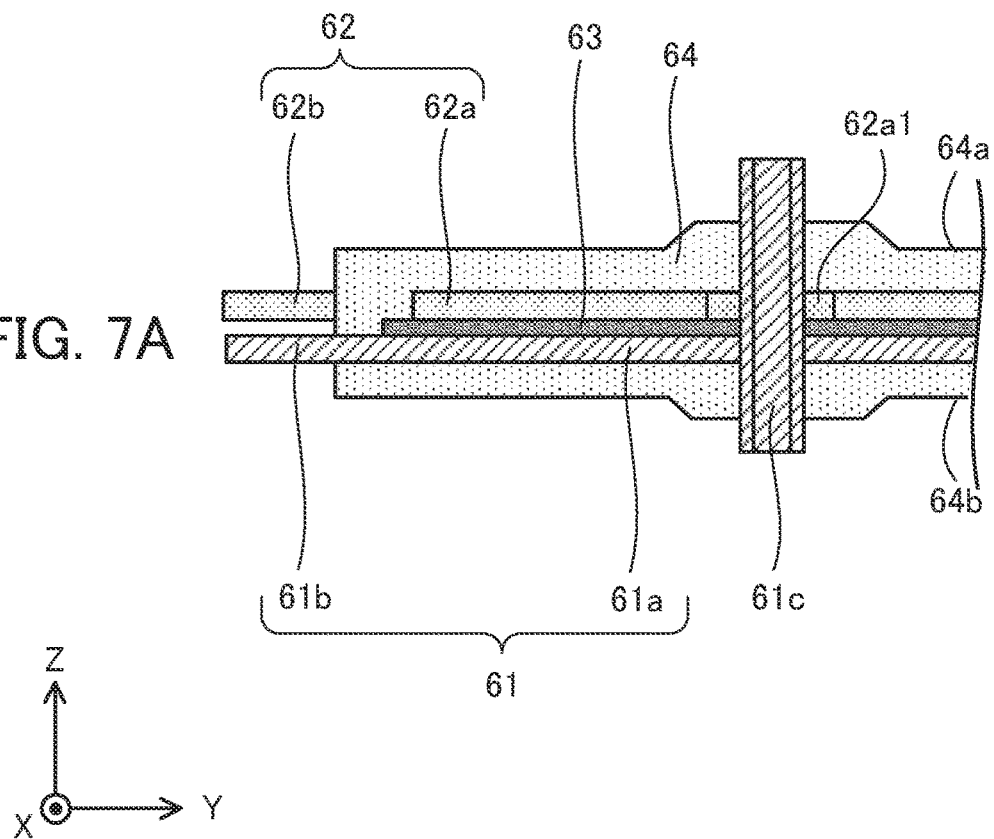
FIGS. 7A and 7B are second sectional views of the bus bar according to the first embodiment.
Figure 7B:
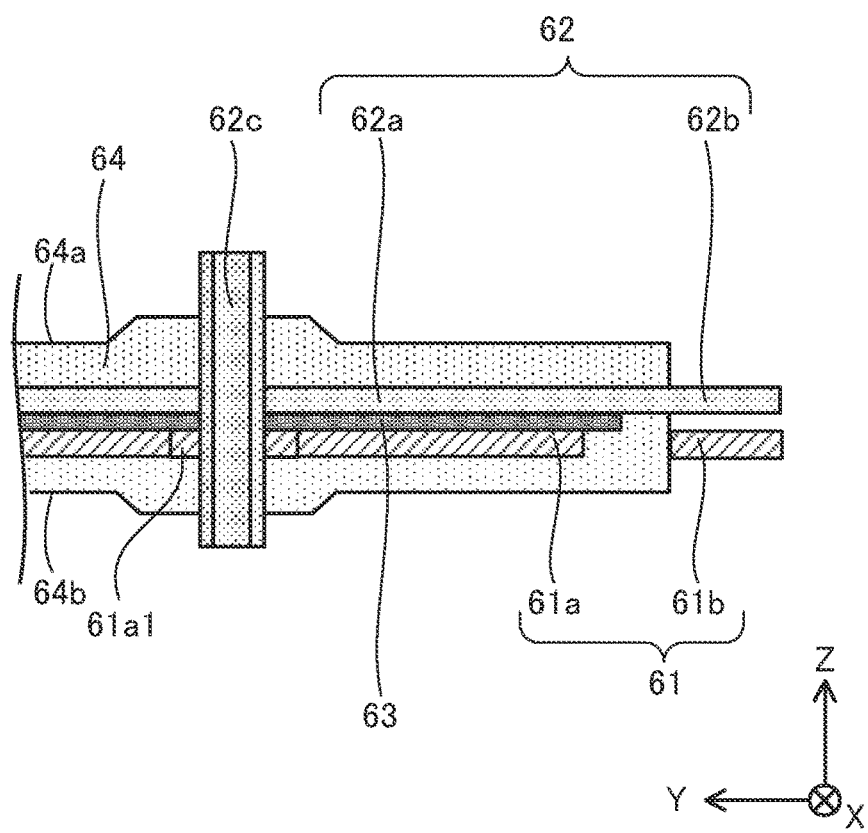

The bus bar 60 will now be described with reference to FIGS. 5, 6, 7A, and 7B. FIG. 5 is a plan view of the bus bar according to the first embodiment. FIGS. 6, 7A, and 7B are sectional views of the bus bar according to the first embodiment. In this connection, FIG. 6 is a sectional view taken along the dash-dotted line Y-Y of FIG. 5. FIGS. 7A and 7B are sectional views taken along the dash-dotted lines X1-X1 and X2-X2 of FIG. 5, respectively.

The bus bar 60 has a sealing body 64 that seals a laminated body 60a. The laminated body 60a is formed by laminating a p-type conductive plate 61, an insulating sheet 63, and an n-type conductive plate 62 in order from the bottom. The p-type conductive plate 61 and the n-type conductive plate 62 are electrically insulated from each other by the insulating sheet 63. In addition, the bus bar 60 includes main terminal connection parts 61c and 62c penetrating the front surface 64a and rear surface 64b of the sealing body 64. The main terminal connection parts 61c and the main terminal connection parts 62c are respectively aligned (in total two lines) along the long-side direction of the sealing body 64.

Both the p-type conductive plate 61 and the n-type conductive plate 62 are both sheet-like (in a flat plate shape). The p-type conductive plate 61 and n-type conductive plate 62 are made using a material with high electrical conductivity as a principal component. Examples of this material include copper and a copper alloy. The p-type conductive plate 61 includes a conductive portion 61a and an external connection portion 61b, and the n-type conductive plate 62 includes a conductive portion 62a and an external connection portion 62b. The conductive portion 61a and external connection portion 61b are integrally connected, and the conductive portion 62a and external connection portion 62b are integrally connected. The conductive portions 61a and 62a are rectangular in plan view. The conductive portions 61a and 62a are each shaped to have at least an area where all the main terminal connection parts 61c and 62c illustrated in FIG. 5 are disposed. The conductive portions 61a and 62a may have the same shape in plan view. The conductive portions 61a and 62a have the main terminal connection parts 61c and 62c, respectively. As will be described later, the conductive portions 61a and 62a have through holes 61a1 and 62a1 through which the main terminal connection parts 62c and 61c pass without contact, respectively. More specifically, the conductive portion 61a has a plurality of through holes 61a1 through which the plurality of main terminal connection parts 62c connected to the conductive portion 62a pass without contact. The conductive portion 62a has a plurality of through holes 62a1 through which the plurality of main terminal connection parts 61c connected to the conductive portion 61a pass without contact. Therefore, the main terminal connection parts 61c have the same potential as the conductive portion 61a, the main terminal connection parts 62c have the same potential as the conductive portion 62a, and the main terminal connection parts 61c have a different potential from the main terminal connection parts 62c.

The main terminal connection parts 62c and 61c are cylindrical and have insertion holes 62c1 and 61c1 into which external connection terminals 40a and 40b are inserted. The insertion holes 61c1 of the main terminal connection parts 61c have a different potential from the insertion holes 62c1 of the main terminal connection parts 62c. The diameters of the main terminal connection parts 62c and 61c may be smaller than those of the external connection terminals 40a and 40b. In this case, the external connection terminals 40a and 40b may be press-inserted into the main terminal connection parts 62c and 61c, respectively.

The main terminal connection parts 61c are electrically and mechanically attached to the conductive portion 61a. For example, as illustrated in FIG. 6, the main terminal connection parts 61c are attached perpendicularly to the principal surface of the conductive portion 61a. As illustrated in FIG. 5, three main terminal connection parts 61c are arranged in a line along the long-side direction. The main terminal connection parts 61c pass through the laminated body 60a and are attached to the conductive portion 61a. In this connection, the conductive portion 62a has the through holes 62a1 through which the main terminal connection parts 61c pass (FIGS. 6 and 7A). The diameters of the through holes 62a1 are sufficiently larger than those of the main terminal connection parts 61c. Therefore, the main terminal connection parts 61c passing through the laminated body 60a do not contact the conductive portions 62a. That is, the main terminal connection parts 61c are electrically insulated from the conductive portion 62a.

Likewise, the main terminal connection parts 62c are electrically and mechanically connected to the conductive portion 62a. For example, as illustrated in FIG. 6, the main terminal connection parts 62c are attached perpendicularly to the principal surface of the conductive portion 62a. As illustrated in FIG. 5, three main terminal connection parts 62c are arranged in a line along the long-side direction. The main terminal connection parts 62c pass through the laminated body 60a and are attached to the conductive portion 62a. In this connection, the conductive portion 61a has the through holes 61a1 through which the main terminal connection parts 62c pass (FIGS. 6 and 7B). The diameters of the through holes 61a1 are sufficiently larger than those of the main terminal connection parts 62c. Therefore, the main terminal connection parts 62c passing through the laminated body 60a do not contact the conductive portion 61a. That is, the main terminal connection parts 62c are electrically insulated from the conductive portion 61a.

The external connection portions 61b and 62b may have the same shape in plan view. The external connection portion 61b is integrally connected to the conductive portion 61a in parallel to an alignment direction in which the main terminal connection parts 61c are aligned, and the external connection portion 62b is integrally connected to the conductive portion 62a in parallel to an alignment direction in which the main terminal connection parts 62c are aligned. The external connection portions 61b and 62b have the same thicknesses as the conductive portions 61a and 62a. The external connection portions 61b and 62b extend from the sealing body 64 to the outside in parallel to an alignment direction in which the main terminal connection parts 61c and 62c are aligned. In addition, the external connection portion 62b is positioned higher than the external connection portion 61b (FIGS. 1, 7A and 7B).

The insulating sheet 63 is sheet-like (in a flat plate shape). The insulating sheet 63 is formed using an insulating material that is compressible and deformable as a principal component. Examples of the insulating material include an aramid paper. That is, the insulating sheet 63 is made using an organic insulating member. The area of the insulating sheet 63 is sufficiently larger than those of the conductive portions 61a and 62a of the p-type conductive plate 61 and n-type conductive plate 62. Therefore, the conductive portions 61a and 62a are able to maintain the insulating property therebetween reliably. In addition, the main terminal connection parts 61c and 62c pass through the insulating sheet 63. In this connection, air spaces (voids, holes) may be generated inside the insulating sheet 63 during the production of the insulating sheet 63.

The laminated body 60a is formed by laminating the p-type conductive plate 61, insulating sheet 63, n-type conductive plate 62 in this order from the bottom, in sufficiently close contact with one another. As compared with the case where the p-type conductive plate 61, insulating sheet 63, and n-type conductive plate 62 are simply laminated, the insulating sheet 63 of the laminated body 60a has small volumes of voids therein and a small roughness of the surface. That is to say, the voids and surface roughness of the insulating sheet 63 are reduced. In this connection, air may be contained in the voids to generate air spaces.

The sealing body 64 seals the above laminated body 60a. The sealing body 64 has a substantially cubic shape. The corners and edges of the sealing body 64 may be rounded or chamfered. The sealing body 64 seals the laminated body 60a, except the main terminal connection parts 62c and 61c, which are a plurality of insertion holes 62c1 and 61c1 in which the external connection terminals 40a and 40b are respectively inserted, and the external connection portions 61b and 62b, which are end portions of the p-type and n-type conductive plates 61 and 62. That is, the main terminal connection parts 61c and 62c penetrate the front surface 64a and rear surface 64b of the sealing body 64. On the front surface 64a and rear surface 64b of the sealing body 64, a pedestal 60b is formed at each penetration position of the main terminal connection parts 61c and 62c. The pedestals 60b project perpendicularly from the front surface 64a and rear surface 64b and are thus thicker than the thickness between the front surface 64a and rear surface 64b. The pedestals 60b enhance the strength of the main terminal connection parts 61c and 62c against the sealing body 64. The pedestals 60b prevent positional shifts of the main terminal connection parts 62c and 61c when the external connection terminals 40a and 40b are attached to the main terminal connection parts 62c and 61c. In addition, when the bus bar 60 is shocked externally after the external connection terminals 40a and 40b are attached to the main terminal connection parts 62c and 61c, for example, the external connection terminals 40a and 40b are kept by the main terminal connection parts 62c and 61c reliably. The heights of the pedestals 60b of the present embodiment are just an example and may be set as appropriate. For example, the heights of the pedestals 60b may be identical to those of the openings at the end portions of the main terminal connection parts 61c and 62c. In this connection, the sealing body 64 is made of the same sealing material as the main body 50.

The following describes a method of manufacturing the semiconductor device 1. For the semiconductor device 1, the semiconductor modules 10 and bus bar 60 are manufactured first. Then, a connection step is executed to attach the external connection terminals 40a and 40b of the semiconductor modules 10 to the main terminal connection parts 62c and 61c of the bus bar 60. By this step, the p-type and n-type conductive plates 61 and 62 of the bus bar 60 are conductively connected to the semiconductor chips 24a and 24b provided in the semiconductor modules 10. In the way described above, the semiconductor device 1 is obtained.

Figure 8:
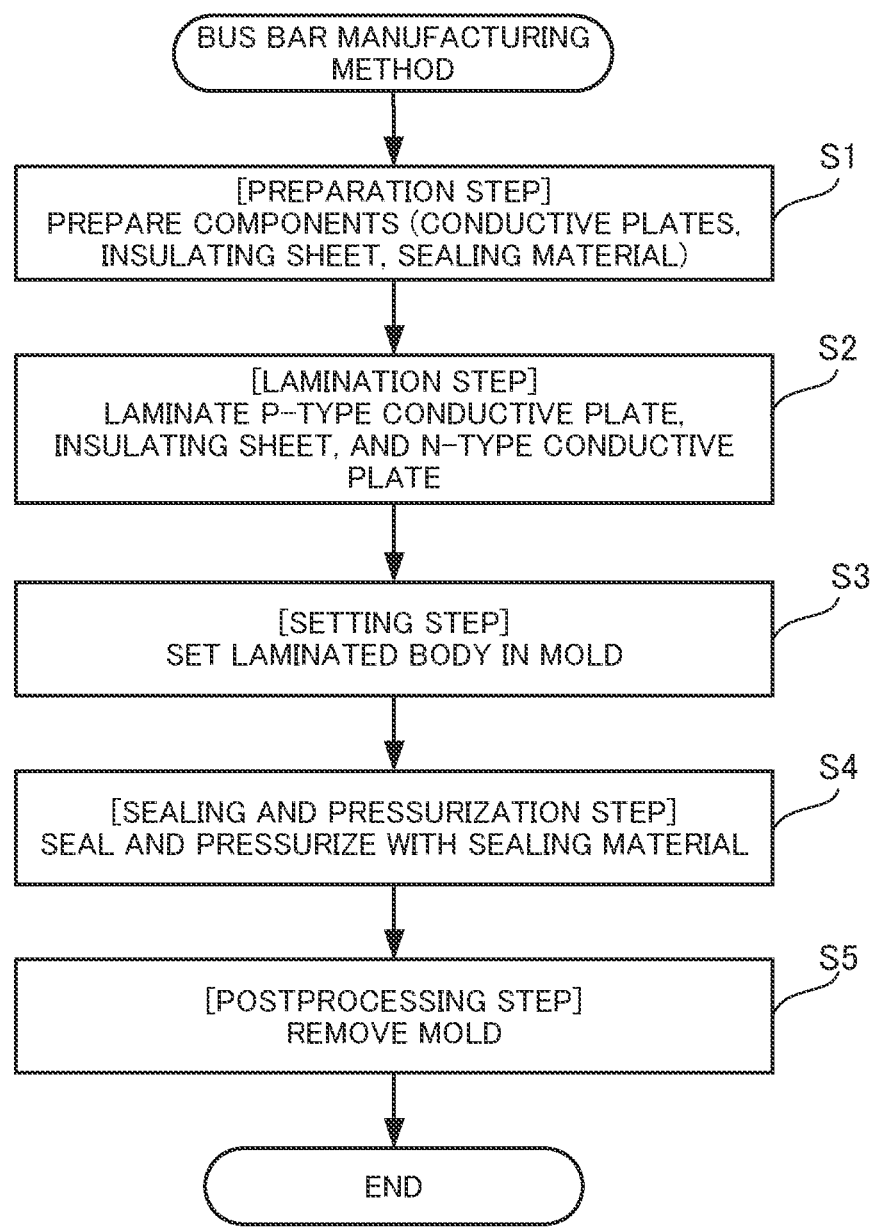
FIG. 8 is a flowchart illustrating a bus bar manufacturing method according to the first embodiment.
Figure 9:
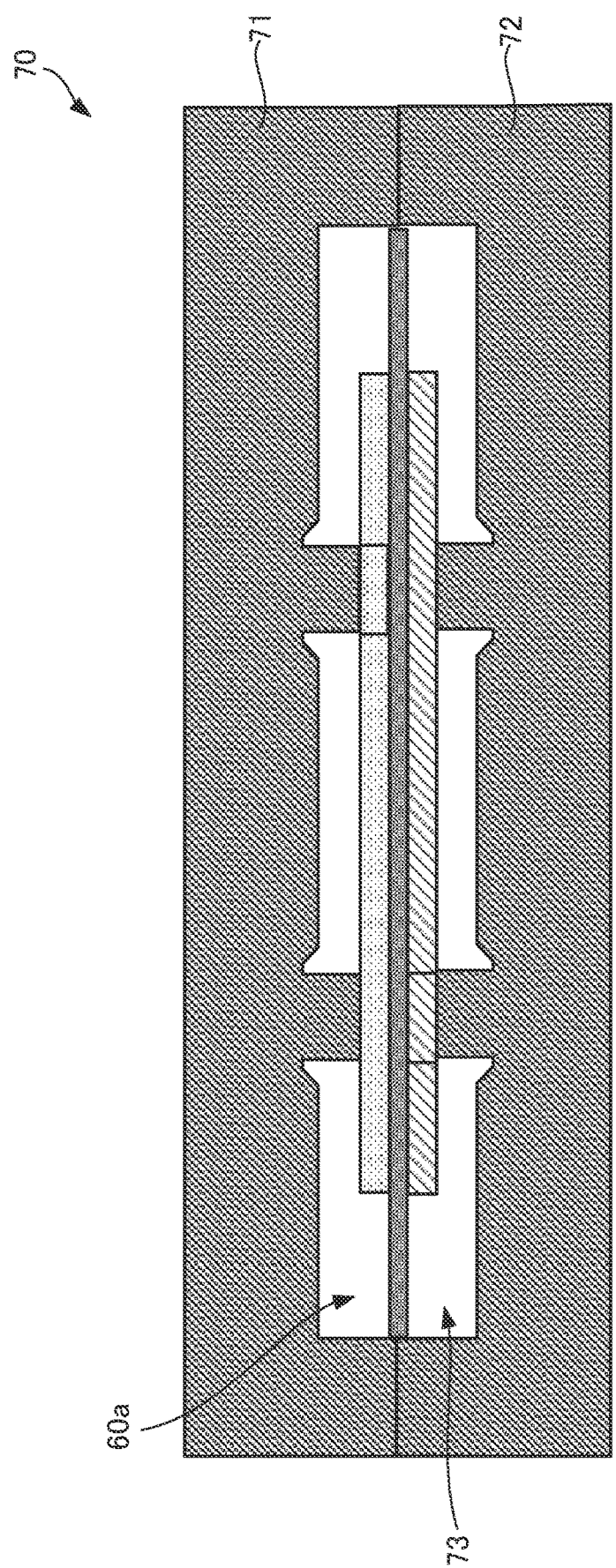
FIG. 9 illustrates a setting step included in the bus bar manufacturing method according to the first embodiment.
Figure 10:
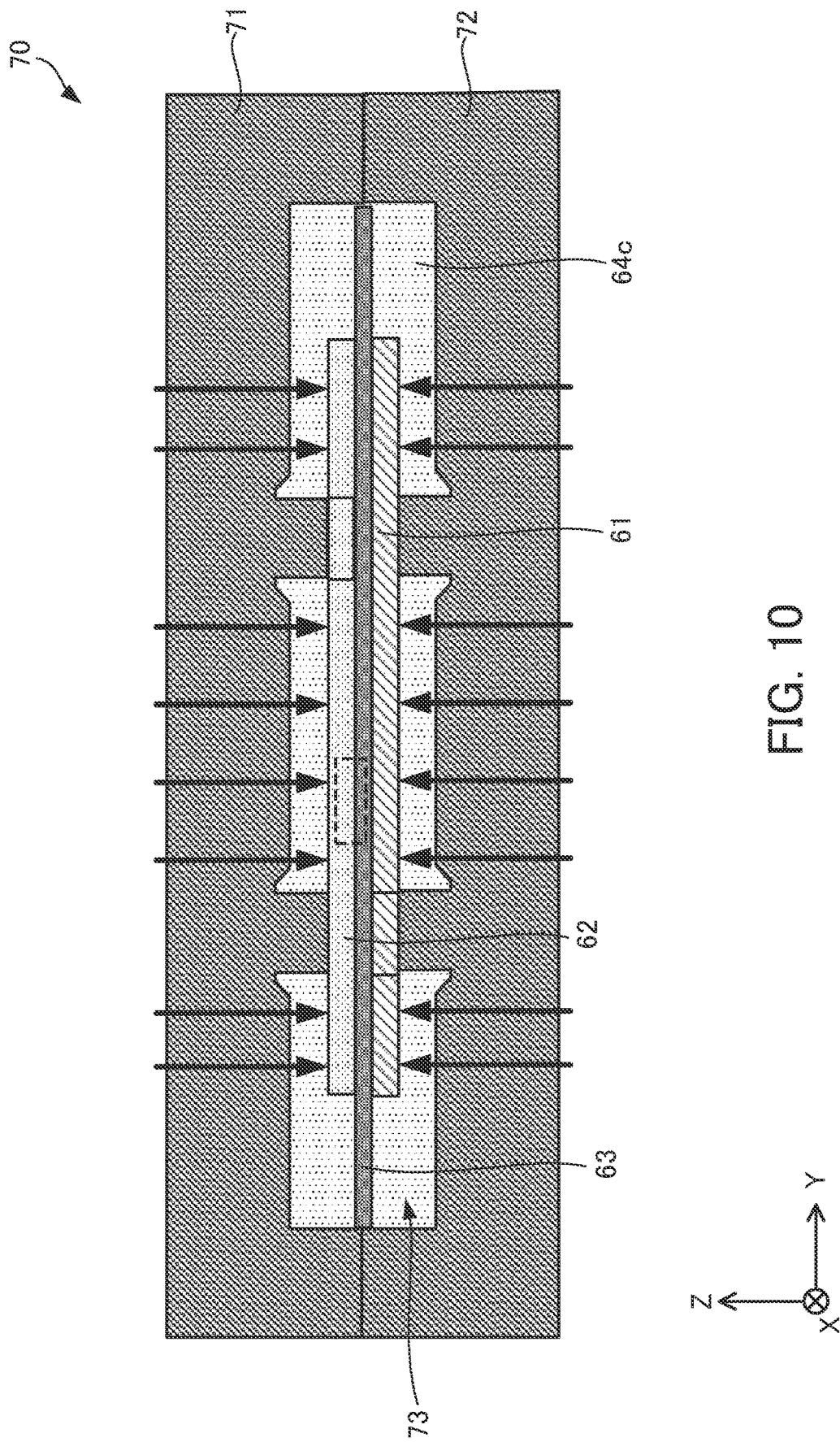
FIG. 10 illustrates a sealing and pressurization step included in the bus bar manufacturing method according to the first embodiment.
Figure 11A:
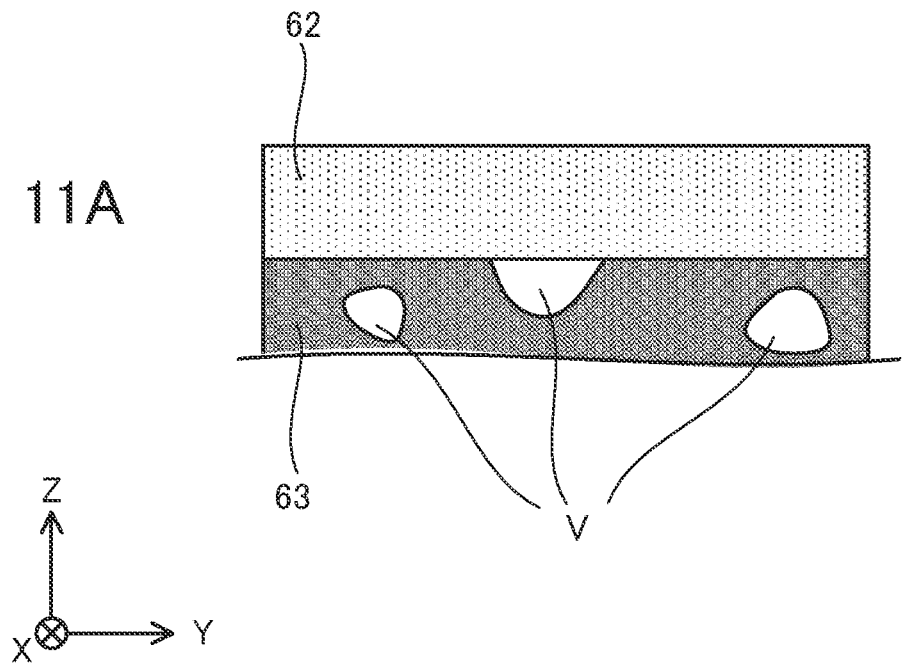
FIGS. 11A and 11B illustrate an insulating sheet at the sealing and pressurization step included in the bus bar manufacturing method according to the first embodiment.
Figure 11B:
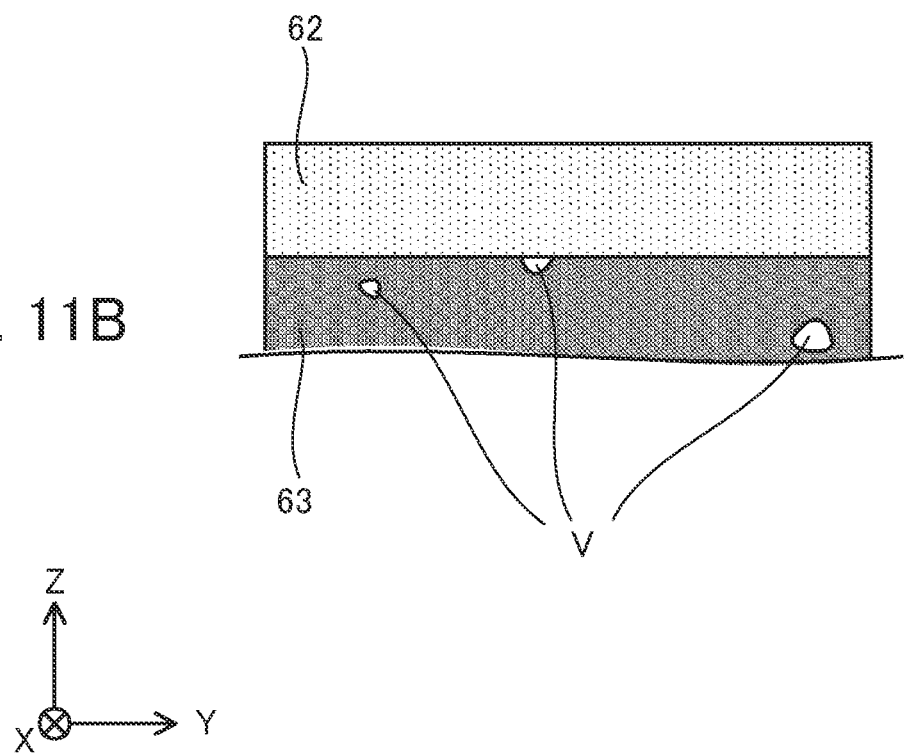
Figure 12:
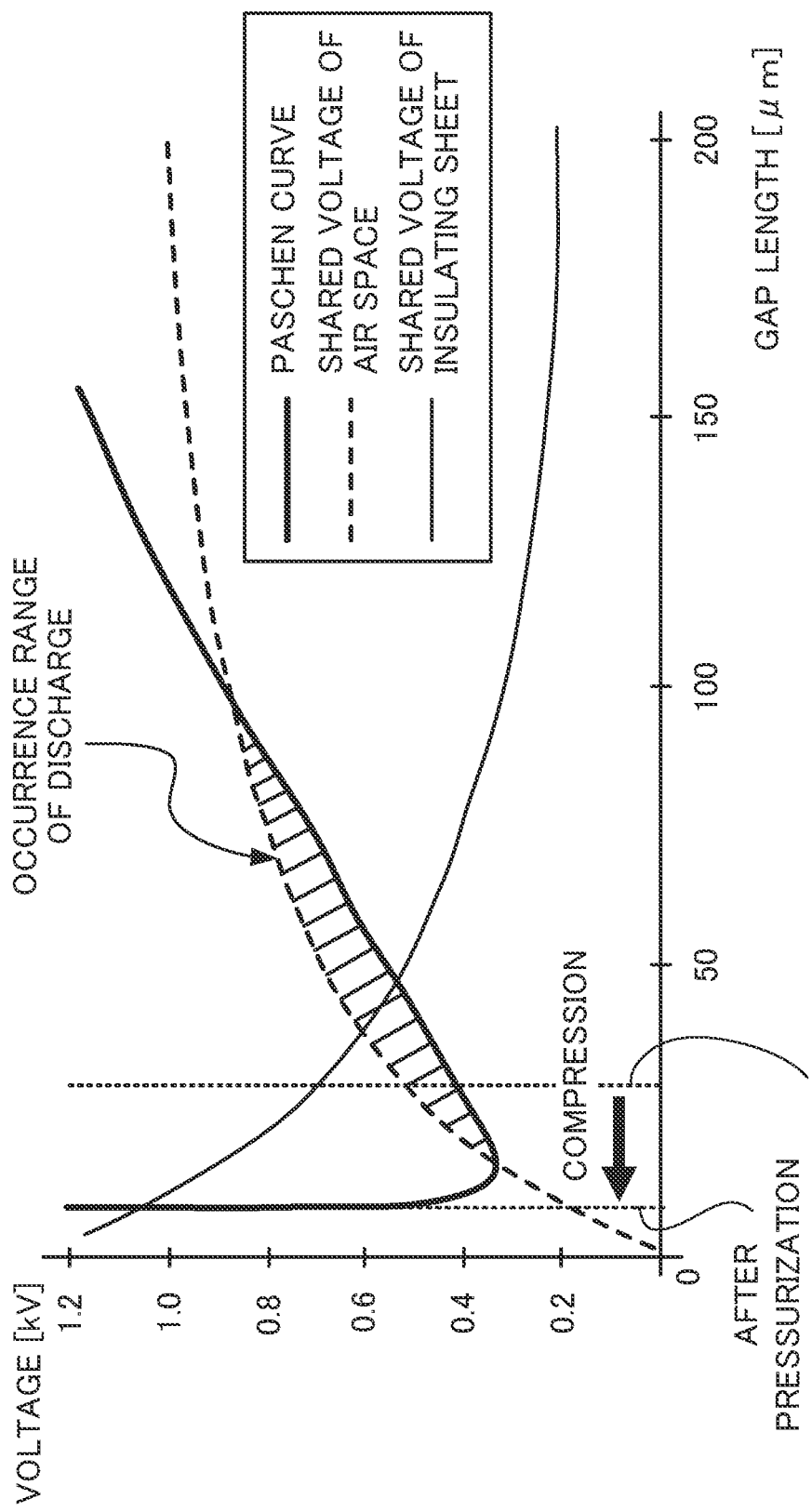
FIG. 12 is a graph of curves of voltage with respect to gap length.

A method of manufacturing the bus bar 60, included in the above-described manufacturing method, will now be described with reference to FIGS. 8 to 12 together with FIGS. 6, 7A, and 7B. FIG. 8 is a flowchart illustrating a bus bar manufacturing method according to the first embodiment. FIG. 9 illustrates a setting step included in the bus bar manufacturing method according to the first embodiment, and FIG. 10 illustrates a sealing and pressurization step included in the bus bar manufacturing method according to the first embodiment. FIGS. 11A and 11B illustrate an insulating sheet at the sealing and pressurization step included in the bus bar manufacturing method according to the first embodiment. FIG. 12 is a graph of curves of voltage with respect to gap length.

The cross sections illustrated in FIGS. 9 and 10 correspond to the cross section (FIG. 6) taken along the dash-dotted line Y-Y of FIG. 5. FIGS. 11A and 11B are schematic enlarged views of a cross section of the interface between the n-type conductive plate 62 and the insulating sheet 63 enclosed by the broken rectangle of FIG. 10. FIG. 11A illustrates the interface between the n-type conductive plate 62 and the insulating sheet 63 before the laminated body 60a is pressurized, whereas FIG. 11B illustrates the interface after the laminated body 60a is pressurized. In FIG. 12, the X axis represents gap length (μm), whereas the Y axis represents voltage (kV). In addition, the curves of the graph represent a Paschen curve, the shared voltage of air space, and the shared voltage of an insulating sheet.

First, a preparation step of preparing components needed for manufacturing the bus bar 60 is executed (step S1). The components include the p-type conductive plate 61, n-type conductive plate 62, main terminal connection parts 61c and 62c, insulating sheet 63, sealing material, and others. In this connection, the p-type conductive plate 61 and n-type conductive plate 62 may be obtained by cutting a conductive plate in desired shapes and forming through holes 61a1 and 62a1 at predetermined positions.

Then, a lamination step of laminating the p-type conductive plate 61, insulating sheet 63, and n-type conductive plate 62 is executed (step S2). The p-type conductive plate 61, insulating sheet 63, and n-type conductive plate 62 are laminated to thereby form the laminated body 60a.

After that, a setting step of setting the laminated body 60a formed at step S2 in a mold 70 is executed (step S3). The mold 70 is formed of an upper mold part 71 and a lower mold part 72, which are put together to form a cavity 73 as an accommodation area inside the mold 70. As illustrated in FIG. 9, the laminated body 60a is sandwiched in the cavity 73 by the upper mold part 71 and the lower mold part 72. The mold 70 is made using a material with high heat resistance as a principal component. Examples of the martial include a cemented carbide alloy of metal. At this time, the areas where the main terminal connection parts 61c and 62c are placed are covered with the mold 70.

Then, a sealing and pressurization step of sealing the inside of the mold 70 with the sealing material 64c and pressurizing the laminated body 60a with the sealing material 64c is executed (step S4). In the mold 70 having the laminated body 60a set in the cavity 73, the sealing material 64c in a melt state is injected from an inlet (not illustrated) while the cavity 73 is kept in vacuum. The injected sealing material 64c fills the cavity 73 to entirely seal the laminated body 60a.

In a situation where the laminated body 60a is entirely sealed with the sealing material 64c, the sealing material 64c is further injected in the cavity 73. During this injection, the laminated body 60a receives a sealing pressure from the sealing material 64c. More specifically, the sealing pressure is applied to the laminated body 60a in parallel to the lamination direction of the laminated body 60a toward the insulating sheet 63, as illustrated in FIG. 10. The sealing pressure here is in the range of 5 MPa to 40 MPa, inclusive.

Before the laminated body 60a receives the sealing pressure, air spaces V exist in the insulating sheet 63, as illustrated in FIG. 11A. In this connection, the term "air space V" is a generic term for voids, holes, and the like. In addition, FIG. 11A illustrates only the side of the insulating sheet 63 where the n-type conductive plate 62 is placed. The air spaces V exist in the entire insulating sheet 63. Note that tiny air spaces may exist between the n-type conductive plate 62 and the insulating sheet 63 and between the p-type conductive plate 61 and the insulating sheet 63, although these are not illustrated. When the bus bar 60 having such air spaces V is energized, partial discharge may occur. Here, there is a concern that, if the partial discharge occurs, the insulating sheet 63 may be damaged and this may reduce the insulating property between the p-type conductive plate 61 and the n-type conductive plate 62.

When the sealing pressure is applied to the laminated body 60a, the air spaces V are pressurized inside the insulating sheet 63. Thereby, as illustrated in FIG. 11B, the air spaces V inside the insulating sheet 63 are compressed and their volumes are reduced. In addition, the volumes of air spaces between the n-type conductive plate 62 and the insulating sheet 63 and between the p-type conductive plate 61 and the insulating sheet 63 are reduced as well.

The following describes partial discharge due to change in the volume of air space V (FIG. 12). FIG. 12 illustrates the case of using an aramid paper for the insulating sheet 63. In FIG. 12, the real line (thick line) represents a Paschen curve, the broken line represents the shared voltage of air space V, and the real line (thin line) represents the shared voltage of the insulating sheet 63. The gap length of the X axis represents the distance between target objects with respect to the Paschen curve, the thickness of an air space V with respect to the air space V, and the thickness of the insulating sheet 63 with respect to the insulating sheet 63. In addition, the voltage of the Y axis represents a discharge voltage with respect to the Paschen curve, and a shared voltage with respect to the air space V and insulating sheet 63. Since the laminated body 60a is compressed toward the insulating sheet 63 in parallel to the lamination direction, the volumes of the air spaces V contained inside the insulating sheet 63 are reduced in the lamination direction as well. Here, the change in the volume of air space V may be regarded as change in the thickness of air space V.

First, the Paschen curve indicates a discharge voltage (Paschen's law) that starts a discharge, which is defined as the product of voltage and gap length. In this connection, the pressure in FIG. 12 is a pressure of one atmosphere. In FIG. 12, when the gap length increases, the discharge voltage that starts a discharge decreases once. When the gap length further increases thereafter, the discharge voltage that causes a discharge increases.

An insulating portion of the laminated body 60a is complex, including the air spaces V and insulating sheet 63. The insulating property of gas (air spaces V) is inferior than that of solid (insulating sheet 63 (except the air spaces V)), so that partial discharge is more likely to occur in the air spaces V than in the insulating sheet 63.

In the case where an insulating portion is complex, the triple point of a conductor and two insulators is a weak point and probably causes a discharge. This is because, in the case where the angle formed by the conductor and an insulator is less than or equal to 90°, the electric field at the triple point tends to infinity. It is known that, in the case where the insulating sheet 63 is formed of an aramid paper, a discharge occurs at such a triple point when an alternating current is applied, and a discharge occurs in air space when a direct current is applied, under adverse conditions. Therefore, it is considered that a discharge is likely to occur if the laminated body 60a contains air spaces therein and a direct current is used for the bus bar 60 including this laminated body 60a.

When a voltage is applied to the laminated body 60a, the voltage is shared by the insulating sheet 63 and air spaces V. At this time, whether a discharge occurs depends on the relationship between the magnitude of the shared voltage (broken line of FIG. 12) and the Paschen curve (thick real line of FIG. 12). That is, a discharge occurs when the shared voltage of air space V exceeds the discharge voltage of the Paschen curve. This is represented as the hatched region in FIG. 12. Since the thicknesses (gap length) of air spaces V that are generated in the insulating sheet 63 are sufficiently smaller than the thickness of the insulating sheet 63, there are air spaces V falling within the hatched region. Therefore, partial discharge is likely to occur in the air spaces V. For example, in the case where an air space V before pressurization has a thickness (gap length) at "before pressurization" in FIG. 12, the shared voltage of the air space V exceeds the discharge voltage of the Paschen curve. If a current flows in the laminated body 60a in this state, a discharge occurs in the air space V. In this connection, change in the shared voltage of the insulating sheet 63 has reciprocal relationship with change in the shared voltage of air space V.

According to the Paschen curve, the gap length and discharge voltage that are the most likely to cause a discharge at a pressure of one atmosphere are approximately 7 μm and 350 V, respectively. Therefore, setting the shared voltage of air space V to this voltage or lower of the Paschen curve makes it possible to prevent the occurrence of discharge in the air spaces V.

For the above reason, in the present embodiment, the laminated body 60a is pressurized in the lamination direction thereof in order to compress the air spaces V contained inside the insulating sheet 63. Referring to FIG. 12, for example, the thickness (gap length) of air space V is compressed from the "before pressurization" to the "after pressurization". The shared voltage of air space V at the "after pressurization" is below the discharge voltage that is the most likely to cause the discharge, given by the Paschen curve. In addition, the shared voltage of the insulating sheet 63 relatively increases with respect to that of air space V. As a result, a discharge voltage that causes partial discharge in the laminated body 60a increases. This means that a discharge becomes unlikely to occur in the laminated body 60a. Especially, in the present embodiment, in the case where the thickness (gap length) of air space V is set to 7 μm or less, the discharge is unlikely to occur in the laminated body 60a.

Then, a postprocessing step of curing the sealing material 64c and removing the mold 70 is executed (step S5). The laminated body 60a is covered with the sealing body 64 obtained by curing the sealing material 64c at step S5. The upper mold part 71 and lower mold part 72 of the mold 70 are removed. At this time, burrs and the like, if generated in the sealing body 64, are removed. Then, the main terminal connection parts 61c are attached to the p-type conductive plate 61. At this time, the main terminal connection parts 61c are inserted in the through holes 62a1 of the n-type conductive plate 62 without contacting the through holes 62a1. Similarly, the main terminal connection parts 62c are attached to the n-type conductive plate 62. At this time, the main terminal connection parts 62c are inserted in the through holes 61a1 of the p-type conductive plate 61 without contacting the through holes 61a1. In the way described above, the bus bar 60 illustrated in FIGS. 5 and 6 is obtained.

The above-described semiconductor device 1 includes the semiconductor modules 10 and the bus bar 60. The semiconductor modules 10 each includes the semiconductor chips 24a and 24b, the plurality of columnar external connection terminals 40a and 40b, which are electrically connected to the semiconductor chips 24a and 24b, and the main body 50 that has therein the semiconductor chips 24a and 24b and one end of each of the external connection terminals 40a and 40b and allows the other end of each of the external connection terminals 40a and 40b to extend perpendicularly from the front surface of the main body 50 facing the semiconductor chips 24a and 24b. The other end of each of the external connection terminals 40a and 40b extending from the main body 50 is inserted in the bus bar 60. The bus bar 60 includes the laminated body 60a formed by laminating the flat plate-shaped p-type conductive plate 61, flat plate-shaped insulating sheet 63, and flat plate-shaped n-type conductive plate 62 in order in close contact with one another. The laminated body 60a includes the main terminal connection parts 62c and 61c into which the other ends of the external connection terminals 40a and 40b are inserted, and is sealed in the sealing body 64 except the main terminal connection parts 62c and 61c. Since the p-type conductive plate 61, insulating sheet 63, and n-type conductive plate 62 of the laminated body 60a are made in close contact with one another by being pressed toward the insulating sheet 63 in parallel to the lamination direction, the volumes of air spaces V contained inside the insulating sheet 63 (and air spaces between the p-type conductive plate 61 and the insulating sheet 63 and between the n-type conductive plate 62 and insulating sheet 63) are compressed. Thereby, a discharge voltage that causes partial discharge in the laminated body 60a increases, and thus a discharge becomes unlikely to occur in the laminated body 60a. As a result, electrical breakdown is prevented in the bus bar 60, which improves the reliability of the semiconductor device 1 having this bus bar 60.

First Modification Example

Figure 13:
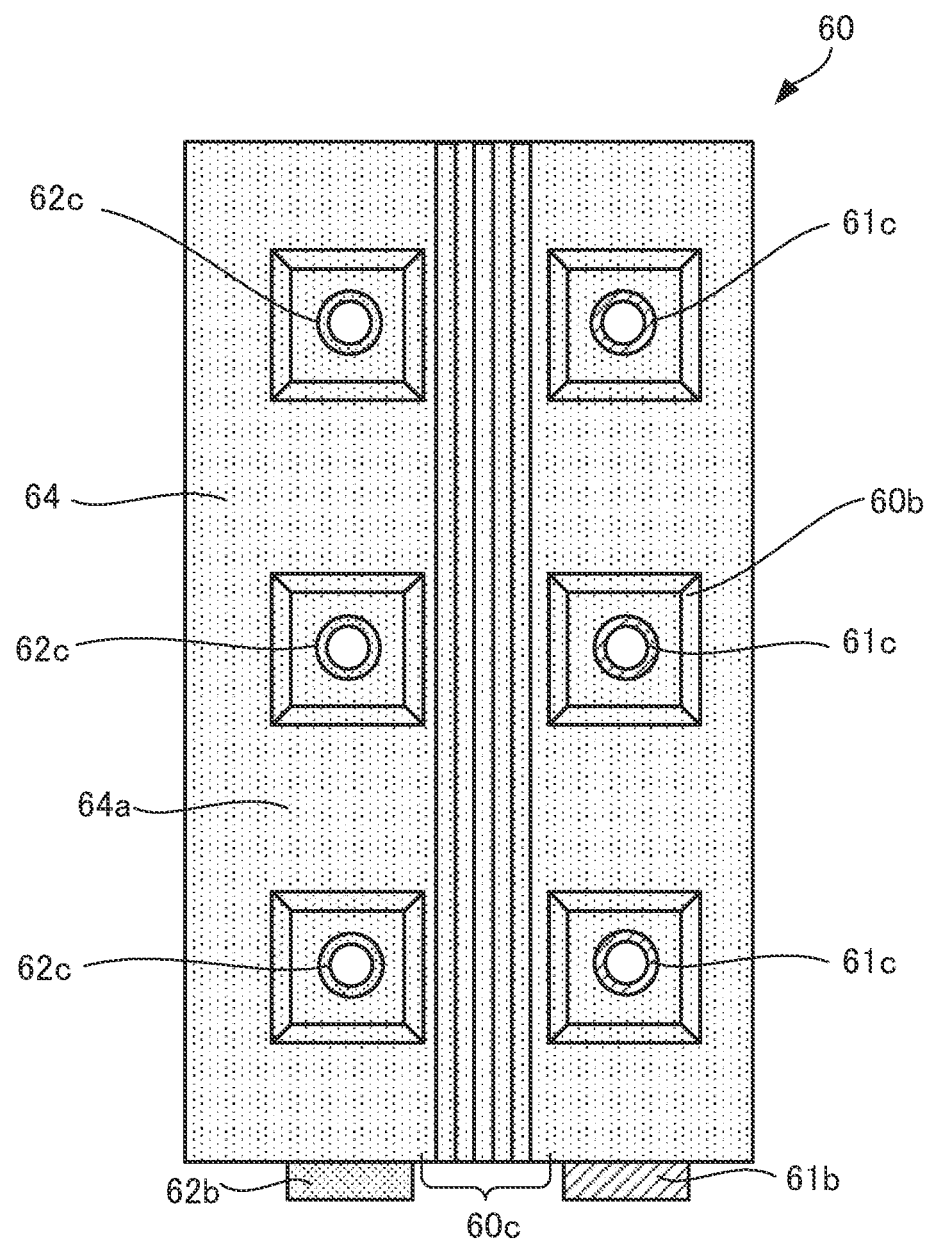
FIG. 13 is a plan view of a bus bar according to a first modification example of the first embodiment.
Figure 14:
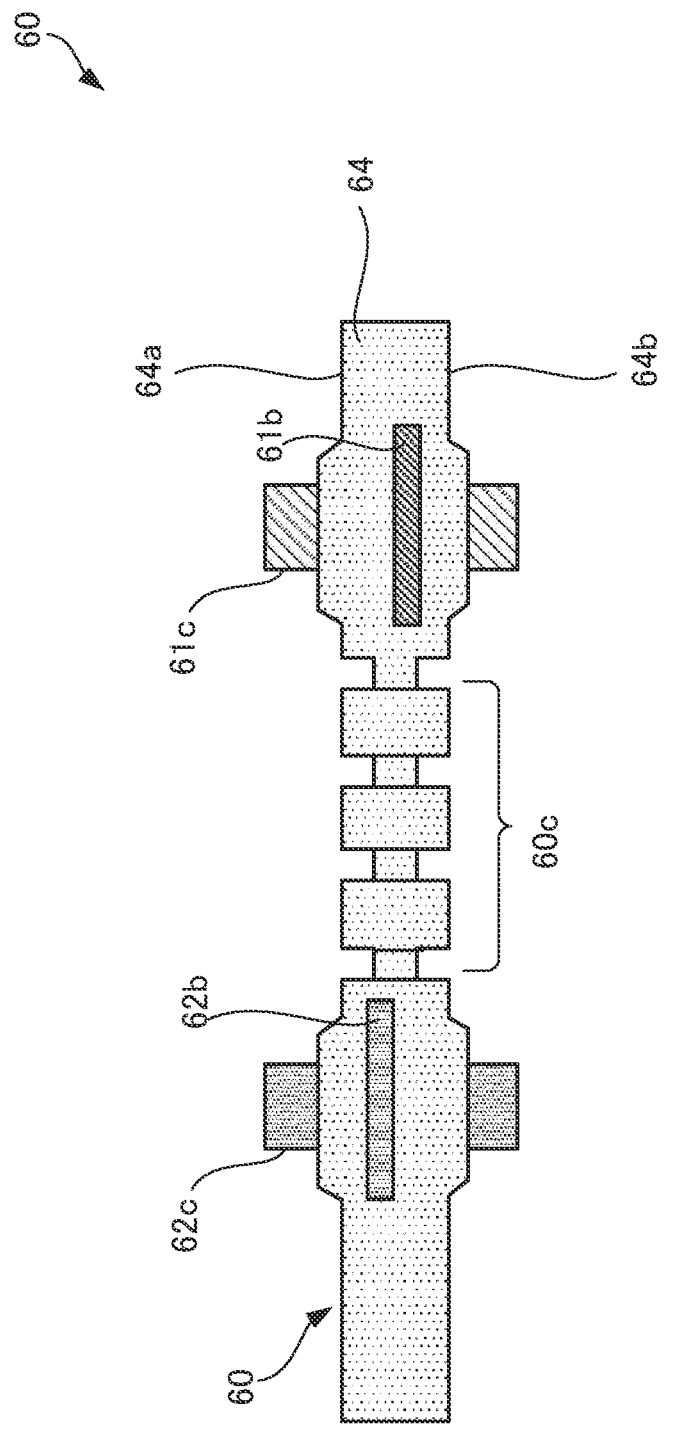
FIG. 14 is a side view of the bus bar according to the first modification example of the first embodiment.

A first modification example of the first embodiment will now be described with reference to FIGS. 13 and 14. FIG. 13 is a plan view of a bus bar according to the first modification example of the first embodiment, and FIG. 14 is a side view of the bus bar according to the first modification example of the first embodiment. In this connection, FIG. 14 is a side view seen in the positive Y direction of FIG. 13. The same reference numerals as used in FIGS. 5 and 6 are given to the corresponding components in the first modification example.

In the bus bar 60 of the first modification example, a plurality of grooves 60c are formed between pedestals 60b where main terminal connection parts 61c (which are connected to a p-type conductive plate 61) extend and pedestals 60b where main terminal connection parts 62c (which are connected to an n-type conductive plate 62) extend, in the front surface 64a. In addition, the plurality of grooves 60c are formed in the rear surface 64b in the same manner, although they are not illustrated. In addition, the grooves 60c are also formed in the side surfaces at the short sides of the bus bar 60, connecting the grooves 60c formed in the front surface 64a and rear surface 64b. The formation of the grooves 60c lengthens the creepage distance between the main terminal connection parts 61c and the main terminal connection parts 62c. This enables maintaining the insulating property between the main terminal connection parts 61c and the main terminal connection parts 62c. Therefore, the bus bar 60 may be downsized.

It is desired that these grooves 60c are formed so as not to reduce the strength of the sealing body 64. Therefore, more grooves 60c may be formed if the grooves 60c are shallow, and less grooves 60c may be formed if the grooves 60c are deep. In addition, the grooves 60c need to be formed at least in the front surface 64a, rear surface 64b, and a side surface (at a side where the external connection portions 61b and 62b extend). Instead of the plurality of grooves 60c, a plurality of convexes (protrusions) may be formed between the pedestals 60b where the main terminal connection parts 61c (which are connected to the p-type conductive plate 61) extend and the pedestals 60b where the main terminal connection parts 62c (which are connected to the n-type conductive plate 62) extend, in the front surface 64a.

Second Modification Example

Figure 15:
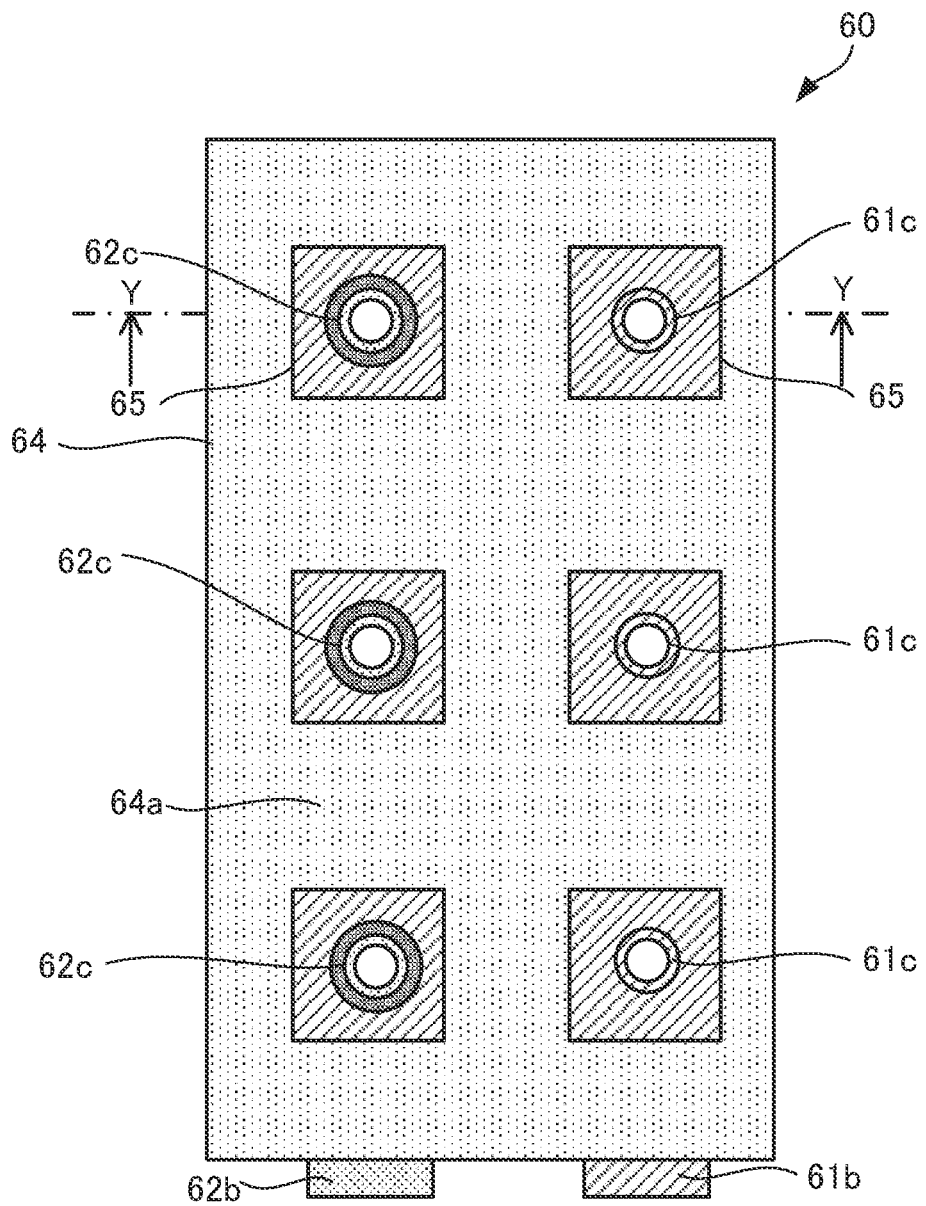
FIG. 15 is a plan view of a bus bar according to a second modification example of the first embodiment.
Figure 16:
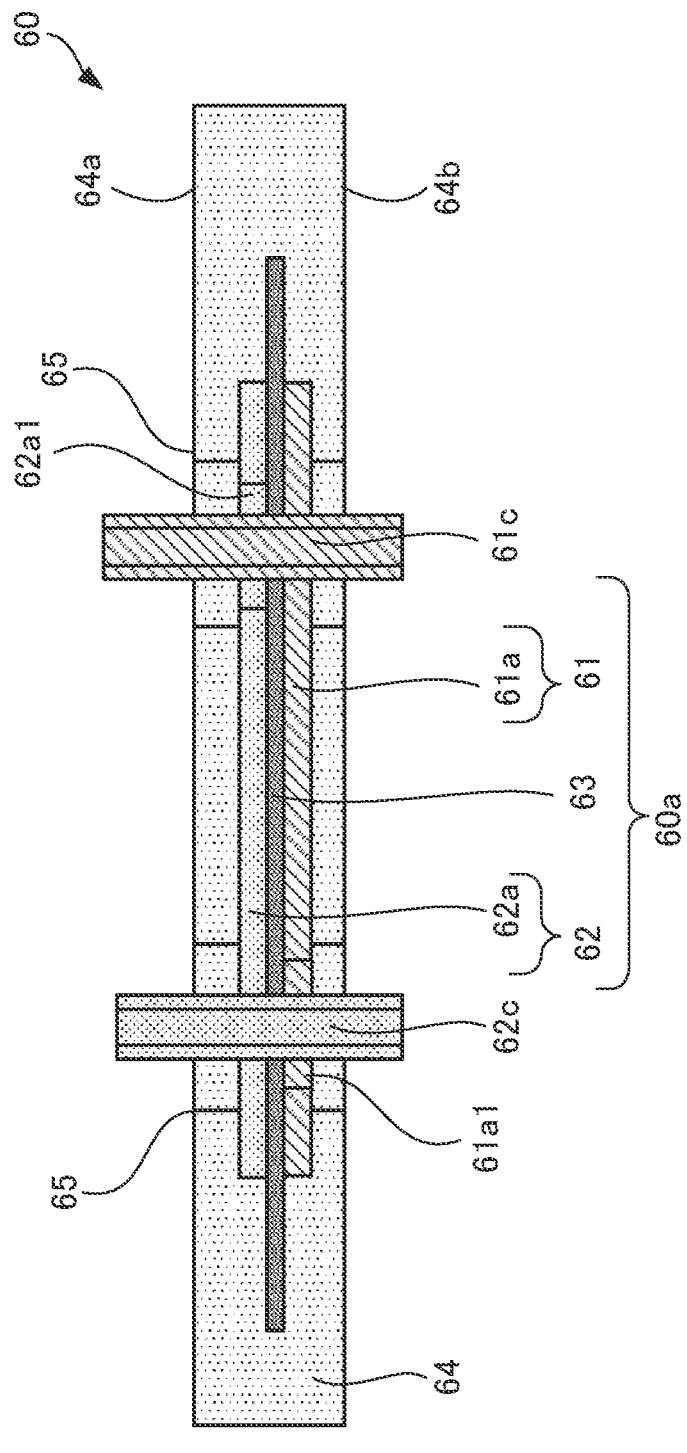
FIG. 16 is a sectional view of the bus bar according to the second modification example of the first embodiment.

A second modification example of the first embodiment will now be described with reference to FIGS. 15 and 16. FIG. 15 is a plan view of a bus bar according to the second modification example of the first embodiment, and FIG. 16 is a sectional view of the bus bar according to the second modification example of the first embodiment. In this connection, FIG. 16 is a sectional view taken along the dash-dotted line Y-Y of FIG. 15. The same reference numerals as used in FIGS. 5 and 6 are given to the corresponding components in the second modification example.

The pedestals 60b of the bus bar 60 illustrated in FIGS. 5 and 6 do not need to be formed. For example, FIGS. 15 and 16 illustrate this case. The bus bar 60 according to the second modification example of FIGS. 15 and 16 has openings 65 in which areas corresponding to the pedestals 60b of the bus bar 60 of FIGS. 5 and 6 are open. Since these openings 65 are formed, the front surface 64a and rear surface 64b of the sealing body 64 both have a lattice pattern. The lattices completely overlap between the front surface 64a and rear surface 64b of the sealing body 64.

In this connection, insertion holes may be formed where appropriate, without providing the main terminal connection parts 61c and main terminal connection parts 62c in the p-type conductive plate 61 and n-type conductive plate 62 exposed in the openings 65. External connection terminals 40a and 40b are inserted in the insertion holes. Alternatively, the main terminal connection parts 61c and main terminal connection parts 62c may be provided in the p-type conductive plate 61 and n-type conductive plate 62 exposed in the openings 65, as in FIGS. 5 and 6.

This bus bar 60 is manufactured in the same manner as in the first embodiment. Note that, since the areas corresponding to the openings 65 are not sealed with a sealing material 64c, a sufficient sealing pressure is not applied by the sealing material 64c. Therefore, the areas corresponding to the openings 65 may be pressurized by the upper mold part 71 and lower mold part 72 of the mold 70, instead of the sealing pressure by the sealing material 64c. This makes it possible to maintain pressurizing the entire front surface 64a and entire rear surface 64b of the laminated body 60a.

Second Embodiment

Figure 17:
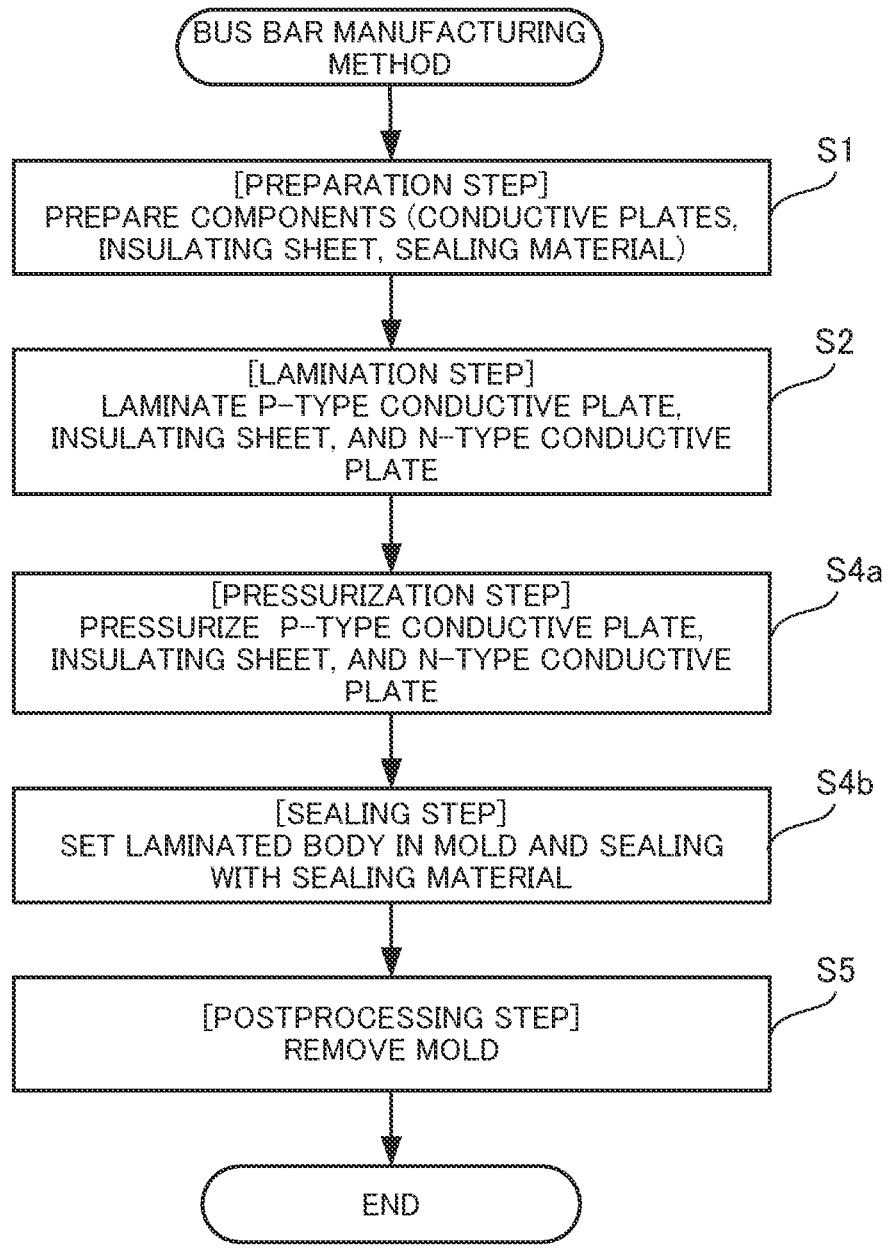
FIG. 17 is a flowchart illustrating a bus bar manufacturing method according to a second embodiment.
Figure 18:
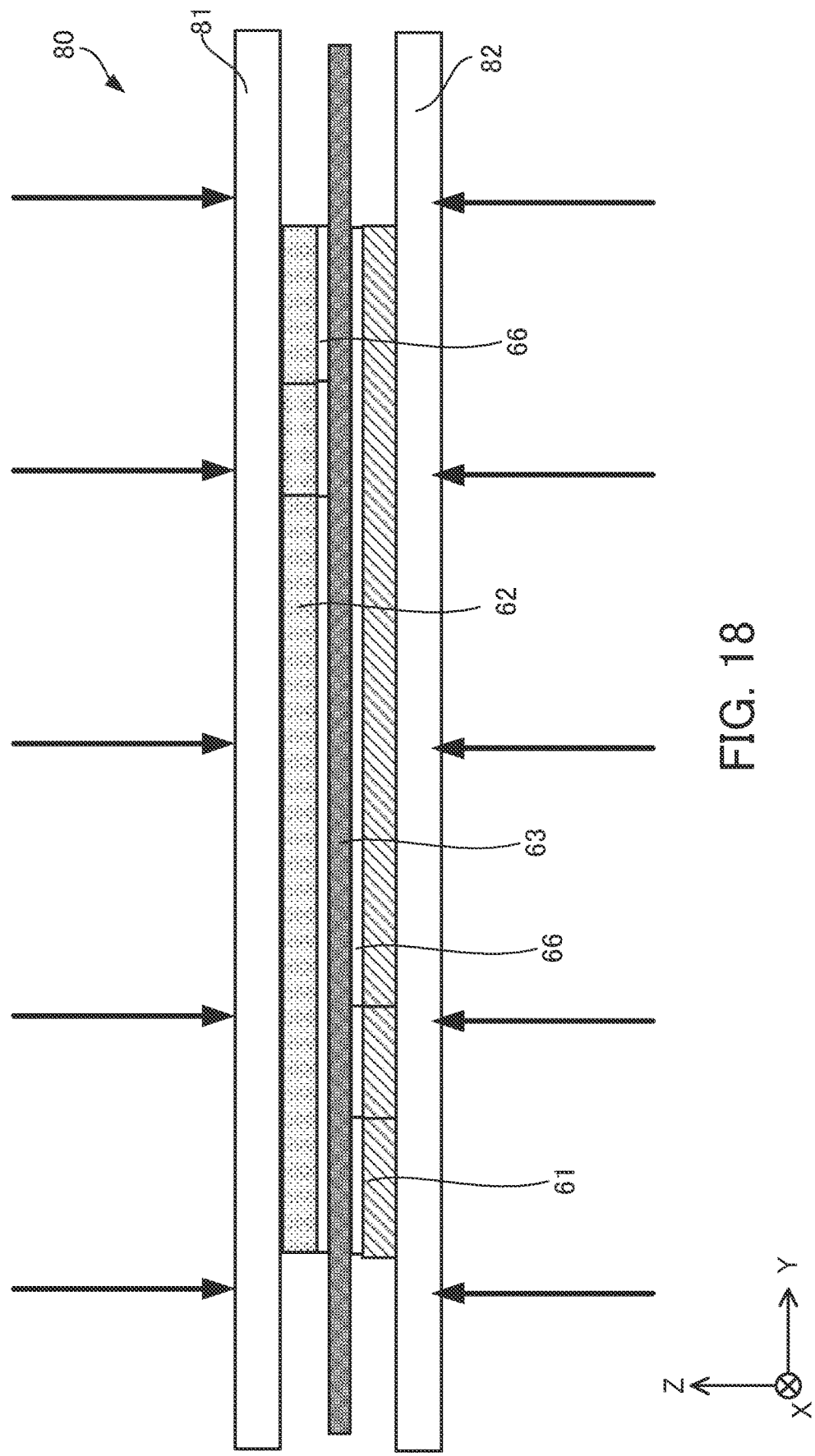
FIG. 18 illustrates a pressurization step included in the bus bar manufacturing method according to the second embodiment.

In a second embodiment, a bus bar manufacturing method different from the method of the first embodiment will be described with reference to FIGS. 17 and 18. FIG. 17 is a flowchart illustrating a bus bar manufacturing method according to the second embodiment, and FIG. 18 illustrates a pressurization step included in the bus bar manufacturing method according to the second embodiment. The same reference numerals as used in the first embodiment will be given to the corresponding components in the second embodiment.

First, as in the flowchart of FIG. 8 according to the first embodiment, steps S1 and S2 are executed in the second embodiment. At step S2 of forming the laminated body 60a, an adhesive layer 66 is interposed between the p-type conductive plate 61 and the insulating sheet 63 and between the insulating sheet 63 and the n-type conductive plate 62. Thereby, the p-type conductive plate 61 and n-type conductive plate 62 are fixed to the insulating sheet 63 in the laminated body 60a. The adhesive layer 66 is sheet-like, for example. In this case, the adhesive layer 66 has through holes formed at positions corresponding to the through holes 61a1 of the p-type conductive plate 61 and the through holes 62a1 of the n-type conductive plate 62. Alternatively, a resin sheet may be used as the adhesive layer 66.

Then, a pressurization step of pressurizing the laminated body 60a with a pressurizing jig 80 is executed (step S4a). The pressurizing jig 80 includes a flat top plate 81 and a flat bottom plate 82 facing the top plate 81. For example, the laminated body 60a is placed on the bottom plate 82. The top plate 81 is then moved toward the bottom plate 82 to press the laminated body 60a. By doing so, the laminated body 60a is pressurized toward the insulating sheet 63 in parallel to the lamination direction of the laminated body 60a, as illustrated in FIG. 18. The pressure at this time is in the range of 5 MPa to 40 MPa, inclusive. Thereby, air spaces V contained inside the insulating sheet 63 are compressed, as in the first embodiment. As a result, a discharge voltage that causes partial discharge in the laminated body 60a increases, and thus the discharge becomes unlikely to occur in the laminated body 60a.

Then, a sealing step of setting the laminated body 60a pressurized at step S4a in the mold 70 and sealing the inside of the mold 70 with the sealing material 64c is executed (step S4b). The setting step of step S3 and the sealing and pressurization step of step S4 in the first embodiment are executed. More specifically, the laminated body 60a is sandwiched in the cavity 73 by the upper mold part 71 and the lower mold part 72 (see FIG. 9). In the mold 70 having the laminated body 60a set in the cavity 73, the sealing material 64c in a melt state is injected from an inlet (not illustrated) while the cavity 73 is kept in vacuum. The injected sealing material 64c fills the cavity 73 to entirely seal the laminated body 60a. After that, the same process as in step S5 of FIG. 8 is performed. As a result, the bus bar 60 is obtained.

According to the disclosure, there is provided a semiconductor device with improved reliability, including a bus bar in which electrical breakdown is unlikely to occur.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
a semiconductor module including a plurality of semiconductor chips and a plurality of external connection terminals, the plurality of external connection terminals being electrically connected to respective ones of the plurality of semiconductor chips and each extending outside the semiconductor module, the semiconductor module being sealed with a first sealing material with parts of the plurality of external connection terminals being exposed outside of the sealing material; and
a bus bar including a laminated body that includes a flat plate-shaped first conductive member, a flat plate-shaped organic insulating member and a flat plate-shaped second conductive member that are directly and sequentially laminated in this order in a lamination direction, the organic insulating member having a void or a surface with roughness, the laminated body having a plurality of insertion holes into which exposed parts of the plurality of external connection terminals are respectively inserted, the first and second conductive members having end portions that respectively form a first external connection portion and a second external connection portion, the bus bar being sealed with a second sealing material with the plurality of insertion holes and the first and second external connection portions being exposed outside of the second sealing material.

2. The semiconductor device according to claim 1, wherein
the bus bar has a rear surface facing the semiconductor module, the rear surface having a lattice pattern with a plurality of openings respectively including the plurality of insertion holes, and
the bus bar has a front surface opposite to the rear surface, the front surface having a lattice pattern with a plurality of openings respectively including the plurality of insertion holes.

3. The semiconductor device according to claim 2, wherein an outer edge of the first conductive member and an outer edge of the second conductive member overlap in a plan view of the semiconductor device in the second sealing material.

4. The semiconductor device according to claim 1, wherein the organic insulating member is an aramid paper.

5. The semiconductor device according to claim 4, wherein the organic insulating member contains an air space.

6. The semiconductor device according to claim 5, wherein a thickness of the air space in the lamination direction is less than 7 µm.

7. A method of manufacturing the semiconductor device of claim 1, the method comprising:
preparing the flat plate-shaped first conductive member, the flat plate-shaped organic insulating member having the void or the surface with roughness, and the flat plate-shaped second conductive member;
directly and sequentially laminating the first conductive member, the organic insulating member, and the second conductive member in this order in the lamination direction, to form the laminated body;
pressurizing the laminated body in the lamination direction to compress the laminated body to thereby reduce the void or roughness;
conductively connecting the first conductive member and the second conductive member to the semiconductor chips;
sealing the semiconductor module with the first sealing material with parts of the plurality of external connection terminals being exposed outside of the first sealing material;
inserting the exposed parts of the plurality of external connection terminals respectively into the plurality of insertion holes; and
sealing the bus bar, including the laminated body, with the second sealing material, with the plurality of insertion holes and the first and second external connection portions being exposed outside of the second sealing material.

8. The method according to claim 7, further comprising after the laminating,
setting the laminated body in a mold, and
filling an inside of the mold with the second sealing material to seal the laminated body while performing the pressurizing with the second sealing material.

9. The method according to claim 8, wherein the filling includes filling the inside of the mold with the second sealing material to seal the laminated body, and further filling the inside of the mold with the second sealing material to perform the pressurizing.

10. The method according to claim 7, further comprising after the pressurizing,
setting the compressed laminated body in a mold, and
filling an inside of the mold with the second sealing material to seal the laminated body with the second sealing material.

11. A semiconductor device, comprising:
a semiconductor module including a plurality of semiconductor chips and a plurality of external connection terminals, the plurality of external connection terminals being electrically connected to respective ones of the plurality of semiconductor chips and each extending outside the semiconductor module; and
a bus bar including a laminated body that includes a flat plate-shaped first conductive member, a flat plate-shaped organic insulating member and a flat plate-shaped second conductive member that are directly and sequentially laminated in this order in a lamination direction, the organic insulating member having a void or a surface with roughness, the laminated body having a plurality of insertion holes into which the plurality of external connection terminals are respectively inserted, the first and second conductive members having end portions that respectively form a first external connection portion and a second external connection portion, the bus bar being sealed with a sealing material with the plurality of insertion holes and the first and second external connection portions being exposed outside of the sealing material, wherein
the semiconductor module has a main body that is rectangular in a plan view of the semiconductor device,
the plurality of external connection terminals are aligned in an alignment direction along a long side of the main body, and
the first external connection portion and the second external connection portion each extend in a direction perpendicular to the alignment direction.

12. The semiconductor device according to claim 11, wherein
the first external connection portion extends in parallel to a long side of the first conductive member, the second external connection portion extends in parallel to a long side of the second conductive member, and
the first external connection portion and the second external connection portion are positioned at different heights in the lamination direction.

13. The semiconductor device according to claim 11, wherein the laminated body has at least one of a groove or a protrusion between two of the plurality of insertion holes in which two of the plurality of external connection terminals are inserted, the two external connection terminals having different electrical potentials.

* * * * *